(12) United States Patent
Haba et al.

(10) Patent No.: US 8,883,563 B1
(45) Date of Patent: Nov. 11, 2014

(54) FABRICATION OF MICROELECTRONIC ASSEMBLIES HAVING STACK TERMINALS COUPLED BY CONNECTORS EXTENDING THROUGH ENCAPSULATION

(71) Applicant: Invensas Corporation, San Jose, CA (US)

(72) Inventors: Belgacem Haba, Saratoga, CA (US); Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/230,521

(22) Filed: Mar. 31, 2014

Related U.S. Application Data

(63) Continuation-in-part of application No. 13/942,568, filed on Jul. 15, 2013.

(51) Int. Cl.
*H01L 21/00* (2006.01)
*H01L 21/56* (2006.01)

(52) U.S. Cl.
CPC ...................................... *H01L 21/56* (2013.01)
USPC ........................................... 438/112; 438/117

(58) Field of Classification Search
CPC .. H01L 23/48; H01L 23/49; H01L 2224/8592
USPC ............................ 438/112, 117, 690; 361/751
See application file for complete search history.

(56) References Cited

U.S. PATENT DOCUMENTS

| | | | |
|---|---|---|---|
| 3,289,452 A | 12/1966 | Koellner | |
| 3,358,897 A | 12/1967 | Christensen | |
| 3,623,649 A | 11/1971 | Keisling | |
| 3,795,037 A | 3/1974 | Luttmer | |
| 3,900,153 A | 8/1975 | Beerwerth et al. | |
| 4,327,860 A | 5/1982 | Kirshenboin et al. | |
| 4,422,568 A | 12/1983 | Elles et al. | |

(Continued)

FOREIGN PATENT DOCUMENTS

| | | |
|---|---|---|
| CN | 102324418 A | 1/2012 |
| EP | 920058 | 6/1999 |

(Continued)

OTHER PUBLICATIONS

"EE Times Asia" [online]. [Retrieved Aug. 5, 2010]. Retrieved from internet. <http://www.eetasia.com/ART_8800428222_480300_nt_dec52276.HTM>, 4 pages.

(Continued)

*Primary Examiner* — Caridad Everhart
(74) *Attorney, Agent, or Firm* — Lerner, David, Littenberg, Krumholz & Mentlik, LLP

(57) ABSTRACT

A microelectronic assembly or package can include first and second support elements and a microelectronic element between inwardly facing surfaces of the support elements. First connectors and second connectors such as solder balls, metal posts, stud bumps, or the like face inwardly from the respective support elements and are aligned with and electrically coupled with one another in columns. The first connectors, the second connectors or both may be partially encapsulated prior to electrically coupling respective pairs of first and second connectors in columns. A method may include arranging extremities of first connectors or second connectors in a temporary layer before forming the partial encapsulation.

17 Claims, 17 Drawing Sheets

(56) References Cited

U.S. PATENT DOCUMENTS

| | | | |
|---|---|---|---|
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A | 3/1992 | Gliga |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,157,080 A | 12/2000 | Tamaki et al. |
| 6,158,647 A | 12/2000 | Chapman et al. |
| 6,164,523 A | 12/2000 | Fauty et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,202,298 B1 * | 3/2001 | Smith ............................ 29/840 |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,388,333 B1 | 5/2002 | Taniguchi et al. |
| 6,407,448 B2 | 6/2002 | Chun |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,528,874 B1 | 3/2003 | Iijima et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,578,755 B1 | 6/2003 | Elenius et al. |
| 6,581,283 B2 | 6/2003 | Sugiura et al. |
| 6,600,234 B2 * | 7/2003 | Kuwabara et al. ............ 257/790 |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Yin et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |

(56) References Cited

U.S. PATENT DOCUMENTS

| | | |
|---|---|---|
| 6,962,864 B1 | 11/2005 | Jeng et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,061,079 B2 | 6/2006 | Weng et al. |
| 7,067,911 B1 | 6/2006 | Lin et al. |
| 7,087,995 B2 * | 8/2006 | Hiatt et al. .................... 257/737 |
| 7,119,427 B2 | 10/2006 | Kim |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,294,928 B2 | 11/2007 | Bang et al. |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,179 B2 | 2/2009 | Kubota et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,621,436 B2 | 11/2009 | Mii et al. |
| 7,633,765 B1 | 12/2009 | Scanlan et al. |
| 7,642,133 B2 | 1/2010 | Wu et al. |
| 7,646,102 B2 | 1/2010 | Boon |
| 7,652,361 B1 * | 1/2010 | Yoshida et al. ............... 257/686 |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,351 B1 | 8/2010 | Berry et al. |
| 7,780,064 B2 | 8/2010 | Wong et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,919,846 B2 | 4/2011 | Hembree |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,039,970 B2 | 10/2011 | Yamamori et al. |
| 8,058,101 B2 | 11/2011 | Haba et al. |
| 8,071,470 B2 | 12/2011 | Khor et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,304,900 B2 | 11/2012 | Jang et al. |
| 8,330,772 B2 | 12/2012 | Cote et al. |
| 8,482,111 B2 | 7/2013 | Haba |
| 8,525,314 B2 | 9/2013 | Haba et al. |
| 8,525,318 B1 | 9/2013 | Kim et al. |
| 8,641,913 B2 | 2/2014 | Haba et al. |
| 8,779,606 B2 * | 7/2014 | Yim et al. .................... 257/790 |
| 2001/0002607 A1 | 6/2001 | Sugiura et al. |
| 2001/0007370 A1 | 7/2001 | Distefano |
| 2001/0021541 A1 | 9/2001 | Akram et al. |
| 2001/0028114 A1 | 10/2001 | Hosomi |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0185735 A1 | 12/2002 | Sakurai et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0036164 A1 | 2/2004 | Koike et al. |
| 2004/0038447 A1 | 2/2004 | Corisis et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262734 A1 | 12/2004 | Yoo |
| 2005/0035440 A1 | 2/2005 | Mohammed |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2007/0015353 A1 | 1/2007 | Craig et al. |
| 2007/0040264 A1 * | 2/2007 | Hall et al. .................... 257/701 |
| 2007/0148822 A1 | 6/2007 | Haba et al. |
| 2007/0181989 A1 | 8/2007 | Corisis et al. |
| 2007/0182012 A1 * | 8/2007 | DeRaedt et al. ............... 257/738 |
| 2007/0190747 A1 | 8/2007 | Humpston et al. |
| 2007/0235850 A1 | 10/2007 | Gerber et al. |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |

(56) References Cited

U.S. PATENT DOCUMENTS

| | | |
|---|---|---|
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 | 9/2008 | Chow et al. |
| 2008/0264899 A1* | 10/2008 | Hsu et al. ........................ 216/18 |
| 2008/0284001 A1 | 11/2008 | Mori et al. |
| 2008/0284045 A1 | 11/2008 | Gerber et al. |
| 2008/0303153 A1 | 12/2008 | Oi et al. |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0045497 A1 | 2/2009 | Kagaya et al. |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0102063 A1 | 4/2009 | Lee et al. |
| 2009/0104736 A1 | 4/2009 | Haba et al. |
| 2009/0127686 A1 | 5/2009 | Yang et al. |
| 2009/0128176 A1 | 5/2009 | Beaman et al. |
| 2009/0160065 A1 | 6/2009 | Haba et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0261466 A1 | 10/2009 | Pagaila et al. |
| 2009/0315579 A1 | 12/2009 | Beaman et al. |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0072634 A1* | 3/2010 | Ha et al. ........................ 257/787 |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0314748 A1 | 12/2010 | Hsu et al. |
| 2010/0327419 A1 | 12/2010 | Muthukumar et al. |
| 2011/0039370 A1* | 2/2011 | Gomyo et al. ................ 438/109 |
| 2011/0068453 A1 | 3/2011 | Cho et al. |
| 2011/0115081 A1* | 5/2011 | Osumi .......................... 257/737 |
| 2011/0140259 A1 | 6/2011 | Cho et al. |
| 2011/0147911 A1 | 6/2011 | Kohl et al. |
| 2011/0241193 A1 | 10/2011 | Ding et al. |
| 2011/0256662 A1* | 10/2011 | Yamano et al. ............... 438/107 |
| 2011/0272449 A1 | 11/2011 | Pirkle et al. |
| 2012/0013001 A1 | 1/2012 | Haba |
| 2012/0015481 A1 | 1/2012 | Kim |
| 2012/0043655 A1 | 2/2012 | Khor et al. |
| 2012/0086130 A1 | 4/2012 | Sasaki et al. |
| 2012/0119380 A1 | 5/2012 | Haba |
| 2012/0280386 A1 | 11/2012 | Sato et al. |
| 2013/0015586 A1 | 1/2013 | Crisp et al. |
| 2013/0082389 A1 | 4/2013 | Crisp et al. |

FOREIGN PATENT DOCUMENTS

| | | |
|---|---|---|
| EP | 2234158 A1 | 9/2010 |
| JP | 61125062 A | 6/1986 |
| JP | 62-226307 | 10/1987 |
| JP | 1012769 A | 1/1989 |
| JP | 64-71162 | 3/1989 |
| JP | 06268015 A | 9/1994 |
| JP | 07-122787 A | 5/1995 |
| JP | 11-074295 A | 3/1999 |
| JP | 11135663 A | 5/1999 |
| JP | 11251350 A | 9/1999 |
| JP | 2001196407 A | 7/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004281514 A | 10/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2003426392 A | 7/2005 |
| JP | 2005183880 A | 7/2005 |
| JP | 2005203497 A | 7/2005 |
| JP | 2005302765 A | 10/2005 |
| JP | 2007123595 A | 5/2007 |
| JP | 2007287922 A | 11/2007 |
| JP | 2008251794 A | 10/2008 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 | 9/2000 |
| KR | 2001-0094894 | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| TW | 200933760 A | 8/2009 |
| TW | 201023277 A | 6/2010 |

(56) References Cited

FOREIGN PATENT DOCUMENTS

| WO | 02/13256 A1 | 2/2002 |
|---|---|---|
| WO | 2006050691 A2 | 5/2006 |
| WO | 2008065896 A1 | 6/2008 |

OTHER PUBLICATIONS

"Wafer Level Stack—WDoD", [online]. [Retrieved Aug. 5, 2010]. Retrieved from the internet. <http://www.3d-plus.com/techno-wafer-level-stack-wdod.php>, 2 pages.

Extended European Search Report for Application No. EP13162975 dated Sep. 5, 2013.

International Search Report and Written Opinion for Application No. PCT/US2011/044346 dated May 11, 2012.

International Search Report and Written Opinion for Application No. PCT/US2012/060402 dated Apr. 2, 2013.

International Search Report and Written Opinion for Application No. PCT/US2013/026126 dated Jul. 25, 2013.

International Search Report and Written Opinion for Application No. PCT/US2013/041981 dated Nov. 13, 2013.

International Search Report and Written Opinion for Application No. PCT/US2013/052883 dated Oct. 21, 2013.

International Search Report and Written Opinion for Application No. PCT/US2013/053437 dated Nov. 25, 2013.

International Search Report and Written Opinion for PCT/US2011/060551 dated Apr. 18, 2012.

International Search Report and Written Opinion PCT/US2011/044342 dated May 7, 2012.

International Search Report Application No. PCT/US2011/024143, dated Sep. 14, 2011.

International Search Report, PCT/US2005/039716, Apr. 5, 2006.

Japanese Office Action for Application No. 2013-509325 dated Oct. 18, 2013.

Jin, Yonggang et al., "STM 3D-IC Package and 3D eWLB Development," STMicroelectronics Singapore/STMicroelectronics France May 21, 2010.

Kim et al., "Application of Through Mold Via (TMV) as PoP base package", 6 pages (2008).

Korean Office Action for Application No. 10-2011-0041843 dated Jun. 20, 2011.

Korean Search Report KR10-2011-0041843 dated Feb. 24, 2011.

Meiser S, "Klein UND Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).

Neo-Manhattan Technology, A Novel HDI Manufacturing Process, "High-Density Interconnects for Advanced Flex Substrates & 3-D Package Stacking,"IPC Flex & Chips Symposium, Tempe, AZ, Feb. 11-12, 2003.

North Corporation, "Processed Intra-layer Interconnection Material for PWBs [Etched Copper Bump with Copper Foil]," NMBITM, Version 2001.6.

Office Action for Taiwan Application No. 100125521 dated Dec. 20, 2013.

Office Action from Taiwan for Application No. 100125522 dated Jan. 27, 2014.

Office Action from U.S. Appl. No. 12/769,930 mailed May 5, 2011.

Partial International Search Report for Application No. PCT/US2012/060402 dated Feb. 21, 2013.

Partial International Search Report for Application No. PCT/US2013/026126 dated Jun. 17, 2013.

Partial International Search Report for Application No. PCT/US2013/075672 dated Mar. 12, 2014.

Partial International Search Report from Invitation to Pay Additional Fees for Application No. PCT/US2012/028738 dated Jun. 6, 2012.

Redistributed Chip Package (RCP) Technology, Freescale Semiconductor, 2005, 6 pages.

Search Report from Korean Patent Applicatin No. 10-2010-0113271 dated Jan. 12, 2011.

U.S. Appl. No. 13/942,568, filed Jul. 15, 2013.

U.S. Appl. No. 10/656,534, filed Sep. 5, 2003.

Yoon, PhD, Seung Wook, "Next Generation Wafer Level Packaging Solution for 3D integration," May 2010, STATS ChipPAC LTD.

\* cited by examiner

FABRICATION OF MICROELECTRONIC ASSEMBLIES HAVING STACK TERMINALS COUPLED BY CONNECTORS EXTENDING THROUGH ENCAPSULATION

CROSS-REFERENCE TO RELATED APPLICATION

The present application is continuation-in-part of U.S. application Ser. No. 13/942,568 filed Jul. 15, 2013, the disclosure of which is hereby incorporated by reference herein.

BACKGROUND OF THE INVENTION

The present invention relates to packaging of microelectronic elements, especially the packaging of semiconductor chips.

Microelectronic elements generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 micron ($\mu$m) thick. The bond pads could include a single layer or multiple layers of metal. The size of the bond pads will vary with the device type but will typically measure tens to hundreds of microns on a side.

Microelectronic elements such as semiconductor chips typically require many input and output connections to other electronic components. The input and output contacts of a semiconductor chip or other comparable device are generally disposed in grid-like patterns that substantially cover a surface of the chip (commonly referred to as an "area array") or in elongated rows which may extend parallel to and adjacent each edge of the chip's front surface, or in the center of the front surface. Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made, further improvements can be made to enhance microelectronic package structures having stack terminals and processes for making such packages.

BRIEF SUMMARY OF THE INVENTION

In accordance with an aspect of the invention, a method is provided of fabricating a microelectronic assembly. In such method, a first subassembly can be processed such that extremities of electrically conductive first connectors of the first subassembly project into a temporary layer, the first connectors extending in a direction away from a first support element of the first subassembly. A first insulating structure of the first subassembly can then be formed comprising flowing a first dielectric material into spaces between individual first connectors between the temporary layer and the support element and at least partially curing the first dielectric material. The temporary layer may then be removed so that extremities of the first connectors project beyond a surface of the first insulating structure of the first subassembly. Thereafter, the first connectors can be united with electrically conductive second connectors of a second subassembly juxtaposed therewith to form an assembly, wherein at least one of the first and second subassemblies has at least one microelectronic element mounted to an inwardly facing surface of the respective support element. A second insulating structure can then be formed comprising flowing a second dielectric material into spaces between adjacent ones of the second connectors and between the first connectors joined thereto.

In accordance with another aspect of the invention, a method is provided for fabricating a microelectronic assembly. Such method can include embedding portions of electrically conductive first masses of a first subassembly into a film, the first masses extending in a direction away from a first support element of the first subassembly. A first encapsulation can be formed comprising flowing a first encapsulant into spaces between individual first masses between the film and the support element and at least partially curing the first encapsulant. The film may then be removed so that the first masses project beyond a surface of the first encapsulation. The first subassembly may then be united with a second subassembly to form an assembly. The second subassembly may comprise a second support element and electrically conductive connectors at a surface thereof, wherein the uniting comprises joining the first masses at locations beyond the first encapsulation with the electrically conductive connectors of the second subassembly. At least one of the subassemblies may have at least one microelectronic element mounted to an inwardly facing surface of the respective support element. A second encapsulation can then be formed comprising flowing a second encapsulant into spaces between adjacent ones of the electrically conductive connectors and the portions of the first masses joined thereto and at least partially curing the second encapsulant.

DETAILED DESCRIPTION OF THE INVENTION

Accordingly, embodiments of the invention herein can provide improved assemblies containing microelectronic elements and having first terminals and second terminals, e.g., top terminals and bottom terminals, in which vertical interconnects which electrically couple the top terminals and bottom terminals provides desirable standoff height while also allowing the vertical interconnects to be tightly packed with desirable pitch in horizontal directions parallel to a face of the microelectronic element in the assembly. Referring to the microelectronic assembly or microelectronic package illustrated in FIGS. 1A-B, in one example, a standoff height H between the second surfaces of the support elements is greater than a pitch "a" of the first connectors in at least one direction parallel to the second surface of the first support element. In another example, the standoff height can be equal to or greater than 1.5 times the pitch.

Figure 1A:
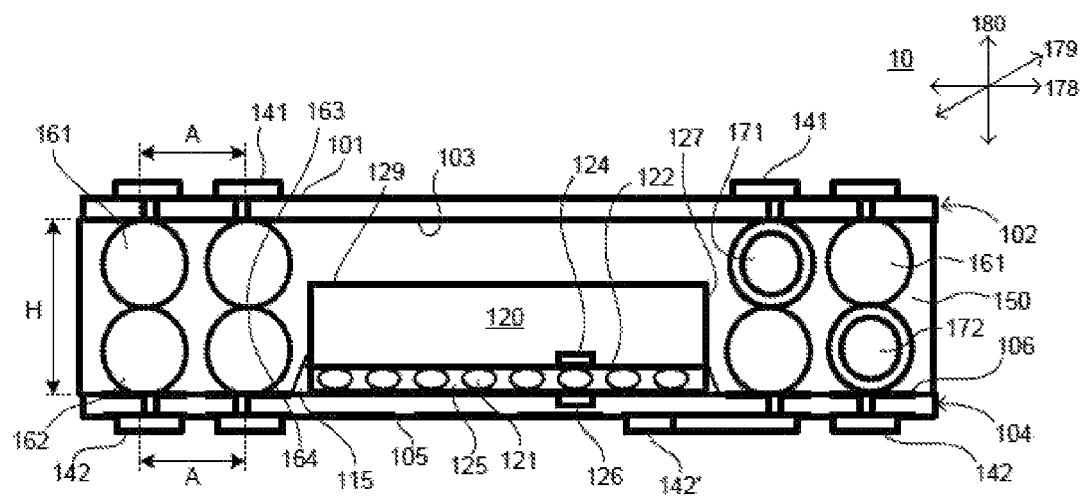
FIG. 1A is a sectional view illustrating a microelectronic package according to an embodiment of the invention.

As further seen in FIG. 1A, the microelectronic package includes a first support element 102 and a second support element 104. Each support element can be, e.g., a package substrate such as a chip carrier or dielectric element or structure which combines two or more of dielectric, semiconductor and electrically conductive materials on which electrically conductive structure such as terminals, traces, contacts, and vias can be provided. For example, one or both support elements can be or include a sheet-like or board-like dielectric element which comprises at least one of inorganic or organic dielectric material, and which may include primarily inorganic material, or primarily polymeric material, or which may be a composite structure comprising both inorganic and polymeric materials. Thus, for example, without limitation, one or both support elements may comprise a dielectric element which includes polymeric material such as polyimide, polyamide, epoxy, thermoplastic material, thermoset materials, among others. Alternatively, one or both support elements may comprise a dielectric element which includes an inorganic dielectric material such as an oxide of silicon, a nitride of silicon, a carbide of silicon, silicon oxynitride, alumina, and one or both support elements can include a semiconductor material such as silicon, germanium, or carbon, among others, or a combination of one or more such inorganic materials. In another example, one or both support elements can comprise a dielectric element which is a combination of one or more polymeric materials and one or more inorganic materials, such as the materials described above. In specific examples, one or both support elements can have a structure of glass-reinforced epoxy such as commonly referred to as "FR-4" or "BT resin" board structures. In another example, one or both support elements may consist essentially of polymeric material such as polyimide, for example. One or both support elements may include one or more layers of compliant material, which in some cases may be exposed at the first surface, the second surface, or both the first and second surfaces of such support element. The compliant material in some cases can comprise polyimide, polyamide which typically have Young modulus less than 2.0 gigapascals ("GPa"), or in some cases the compliant material may include an elastomer having a Young's modulus which is significantly lower, e.g., well below 1.0 GPa.

As seen in FIG. 1A, each support element has first and second oppositely facing surfaces. As assembled in the package 10, first surfaces 101, 105 of the support elements face outwardly away from one another, and the second surfaces 103, 106 face inwardly towards one another. A microelectronic element 120 which may be an unpackaged or packaged semiconductor chip is mounted to the second surface of one or both of the support elements 102, 104. In a particular embodiment, the microelectronic element can be a semiconductor chip having additional electrically conductive structure at a face thereof coupled to pads of the chip. Although not shown, in one embodiment, a second microelectronic element can be mounted in a space above a surface 129 of the microelectronic element 120 which faces away from support element 104. The second microelectronic element can be positioned between surface 129 and the surface 103 of the first support element 102.

The microelectronic element can be electrically coupled with conductive elements at a surface 106 of the second support element 104. As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate. In one example, the "surface" of the component may be a surface of dielectric structure; however, in particular embodiments, the surface may be a surface of other material such as metal or other electrically conductive material or semiconductor material.

In FIG. 1A, the directions parallel to the first surface 101 of the first support element are referred to herein as first and second transverse directions 178, 179 or "horizontal" or "lateral" directions, whereas the directions 180 perpendicular to the first surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

Thus, in an example seen in FIG. 1A, the microelectronic element 120 may be flip-chip connected to contacts 126 at surface 106 of support element 104. Microelectronic element 120 has a plurality of contacts 124 at the front face 122 which face towards the second surface 106 of second support element 104, the contacts 124 facing and joined with corresponding contacts 126 of the second support element through bumps 121 that can include bond metal, or which can include other types of joining elements such as micropillars, posts, among others. The contacts can be arranged at the front face 122 in one or more rows extending in a first direction, one or more columns extending in a second direction transverse to the first direction, or in both one or more rows and one or more columns. Such contacts can be disposed at any positions in directions 178, 179 or may be disposed in one or more rows, one or more columns, or in one or more rows and in one or more columns adjacent to one or more edges 127 of the microelectronic element. In a particular example, the contacts 124 can be distributed across at least a portion of the front face of the microelectronic element in an area array having two or more rows of contacts and having two or more columns of contacts. An underfill 115 may be disposed surrounding individual ones of the connections, e.g., bumps 121, which in some cases may mechanically reinforce the connections.

Alternatively, instead a flip-chip connection, the contacts 124 can be arranged at positions within one or more rows of contacts and/or one or more columns of contacts which are aligned with an aperture or "bond window" (not shown) that extends between the first and second surfaces 105, 106 of the support element 104. In such case, the contacts 124 of the microelectronic element can be coupled with terminals, e.g., terminals 142, 142' at the first surface 105 of the second support element 104 through leads which are joined to the contacts 124. In a particular example, the leads can be wire leads (not shown), e.g., wire bonds, which extend through the aperture and are joined to the contacts 124 and to corresponding contacts (not shown) at the first surface 105. In another example, the leads can be leads each of which includes an first portion extending as a trace along the first or second surfaces 105, 106 and a second portion integral with the first portion which extends from the trace into the area of the aperture and is joined to the contact.

In still another example, although not shown, a rear surface 129 of the microelectronic element can be back-bonded to the second surface 106 of the second support element and the front face 122 of the microelectronic can instead face away from the first surface 106 of support element 104, with the contacts 124 of the microelectronic element facing away from the second surface 106. In such example, the contacts 124 can be electrically coupled with corresponding contacts at the second surface 106 of the second support element through conductive structure which extends above the front face 122 and which extends beyond edges 127 of the microelectronic element.

As further seen in FIG. 1A, the microelectronic package 10 can include a monolithic encapsulation 150 which is formed in contact with the second surface 103, or 106 of a support element of the first and second support elements, and which is formed in contact with at least one of: the second surface of another support element of the first and second support elements, and a second encapsulation which is formed in contact with the second surface of the another support element. The encapsulation 150 can be formed in contact with the second surfaces 103, 106 of each of the first and second support elements 102, 104.

As further seen in FIG. 1A, microelectronic package 10 includes pairs of electrically conductive first connectors 161 projecting above the second surface 103 of the first support element 102 which are aligned with and which are mechanically and electrically coupled with corresponding electrically conductive second connectors 162 projecting above the second surface 106 of the second support element 104. First package terminals 141 at the first surface 101 of the first support element 102 are electrically coupled with corresponding second package terminals 142 at the first surface 105 of the second support element 104 through respective pairs of the first connectors 161 which are aligned with and electronically coupled with, e.g., joined with the second connectors 162.

As further seen in FIG. 1A, at least one of: the first connectors and the second connectors include electrically conductive masses, such as masses of a bond metal, e.g., tin, indium, solder or a eutectic material, or a conductive matrix material of metal particles embedded in a polymeric material. In particular embodiments, the first connectors, the second connectors, or both can consist essentially of solder. In the particular embodiment illustrated in FIG. 1, the first connectors and the second connectors can each include a bond metal. In a particular example, one or both of the first and second connectors may include a solid core, e.g., core 171 or core 172 over which a bond metal can be provided. Such solid cores 171, 172 can be used to facilitate or maintain a predetermined spacing between the second surfaces 103, 106 of the first and second support elements 102, 104. Solid cores can be of electrically conductive, semiconducting or dielectric material or a combination of one or more such materials. In a particular example, the solid cores can be made of non-solder material that is wettable by solder and can be coated with solder. In one example, a solid core may consist essentially of copper or other electrically conductive material having a melting point higher than a joining temperature at which the first and second connectors are joined to one another, as will be described below.

In a particular embodiment, the solid cores can comprise or consist essentially of a solder which has a melting point higher than the joining temperature, and thus may have a higher melting point than the melting point of a solder that coats the solid cores. In another example, a solid core may consist essentially of glass, ceramic or semiconductor material. First connectors having solid cores 171 can be aligned and joined with second connectors which do not have solid cores. Conversely, second connectors having solid cores 172 can be aligned and joined with first connectors which do not have solid cores. In another embodiment, although not shown, first connectors which have solid cores can be aligned and joined with second connectors which have solid cores.

In various examples provided herein, it can be seen that the first connectors and the second connectors can have ends 163, 164, respectively, which are defined by their maximum heights above the second surface of the first and second support elements, and the ends 163 of the first connectors can be aligned with and joined with the ends 164 of the second connectors. As further seen in FIG. 1A, in one example, a pitch "a" between first terminals 141 at the first surface of first support element 102 can be the same as a pitch "a" between second terminals 142 at the first surface of the second support element 104.

Figure 2:
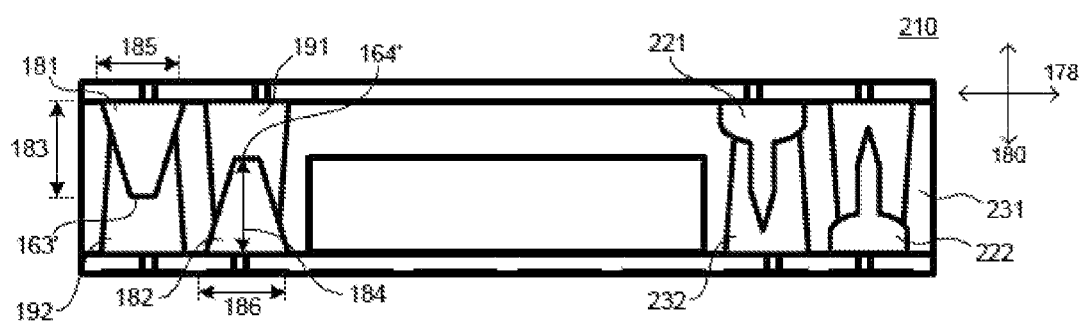
FIG. 2 is a sectional view illustrating a microelectronic package according to an embodiment of the invention.

Referring to FIG. 2, in another example of a microelectronic package 210, the first connectors 181, the second connectors 182 or both can comprise substantially rigid solid metal posts which project above the second surface of the respective support element. In one example, the posts may consist essentially of copper. Typically, the posts have vertical dimensions 183, 184 in a vertical direction 180 of a thickness of the microelectronic assembly. The vertical dimensions typically range between 50 and 500 micrometers. The vertical dimension of each post typically is greater than half the respective width 185 or 186 of such post in a second direction 178 parallel to a plane of the first component or second component from which the post extends. In a particular embodiment, the posts can be formed through a process that includes etching to remove material from a metal layer, which can facilitate making of a package having first posts 181 whose ends 163' have a high degree of co-planarity. Likewise, such process can facilitate making a package having second posts 182 whose ends 164' have a high degree of co-planarity. Typical etching processes tend to form posts which are frustoconical in shape, since the material removal proceeds in both vertical 180 and lateral directions 178, 179. However, certain subtractive processes can reduce the degree of material removal in the lateral direction such that posts formed in this manner can have more cylindrical shape. In yet another example, the posts may be formed by plating a metal into openings of a temporary layer such as a photoresist mask, and then removing the temporary layer. Solid or hollow metal posts can result from such plating process.

The respective first or second connectors 191, 192 of the other support element to which the metal posts are joined can comprise electrically conductive masses such as a bond metal, e.g., solder, tin, indium or a eutectic material. In an example, the first connectors 221, the second connectors 222 or both can comprise stud bumps which project above the second surface of the respective support element. In particular examples, the stud bumps can be of gold, copper or may consist essentially of copper. In an example, a plated coating or barrier layer of a metal such as palladium, titanium, tungsten, tantalum, cobalt, nickel, or conductive metal compound such as a compound of one or more of such metals may be present at interfacial surfaces of the stud bumps with the conductive masses 231 to which they are coupled. In FIG. 2 and in many other figures herein, terminals and other elements of package 210 may be omitted from the particular view shown, although they may nevertheless be present.

Figure 3:
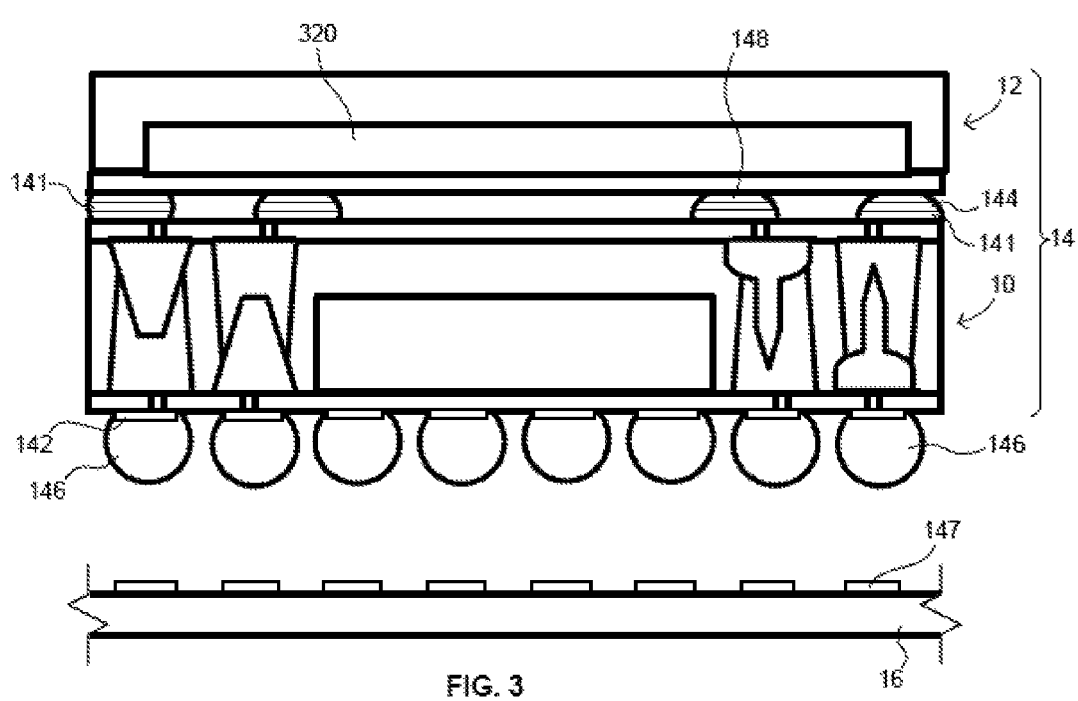
FIG. 3 is a sectional view illustrating a microelectronic assembly according to an embodiment of the invention.

FIG. 3 illustrates an assembly 14 of the microelectronic package 10, in which an external component 12 is stacked above the package 10 and electrically coupled with the first terminals 141 thereof. For example, the external component 12 may have contacts 148 joined to the first terminals 141 through electrically conductive masses 144 of a bond metal, e.g., tin, indium, solder, eutectic metal composition, etc. In one example, the external component 12 can be a circuit panel having traces and contacts thereon, and which may have additional components therein or coupled thereto. In some further examples, the external component can be a packaged or unpackaged microelectronic element. For example, component 12 can be a microelectronic package comprising a second microelectronic element 320 having a set of contacts 148 joined with the terminals 141.

As further shown in FIG. 3, the microelectronic package 10 can have electrically conductive joining elements 146 such as masses of a bond metal, e.g., solder, tin, indium or eutectic material or other such material attached to the second terminals 142, the joining elements 146 used for joining the microelectronic package 10 to contacts 147 of an external component 16. The external component 16 in some cases may be a circuit panel having traces and contacts thereon, and which may have additional components therein or coupled thereto. In some further examples, the external component can be a packaged or unpackaged microelectronic element.

Figure 4A:
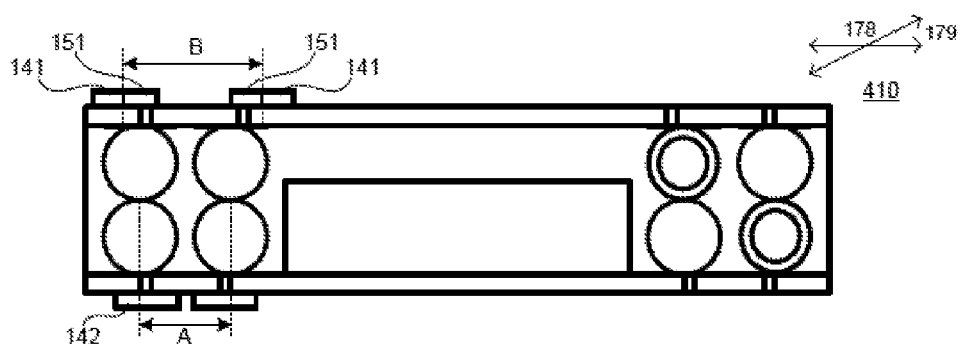
FIG. 4A is a sectional view illustrating a microelectronic package according to a variation of the embodiment of the invention seen in FIGS. 1A-B.
Figure 4B:
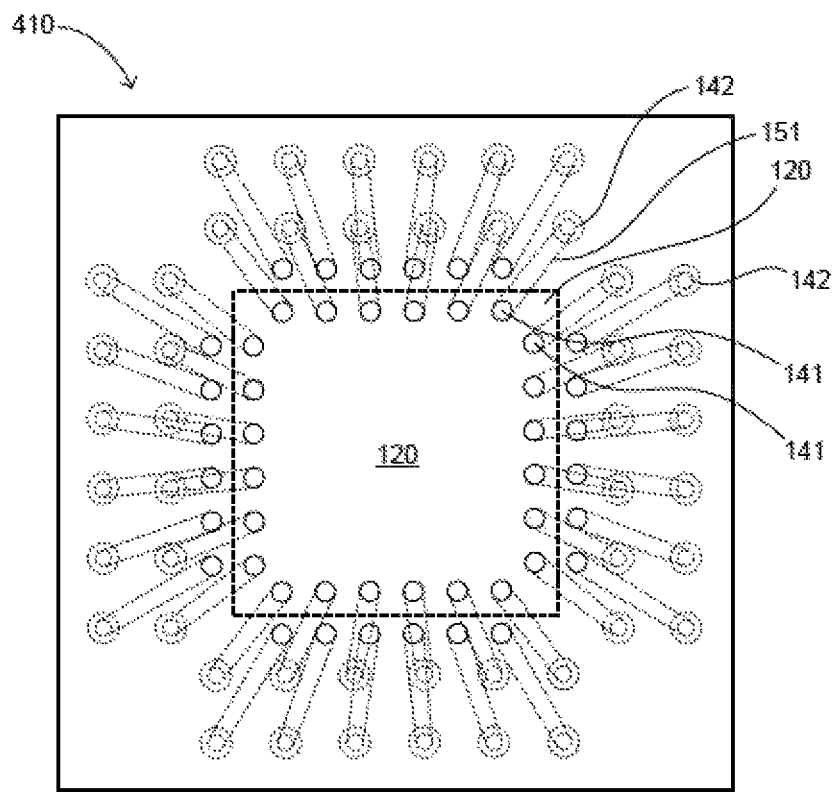
FIG. 4B is a top-down plan view illustrating an example of the microelectronic package of FIG. 4A looking towards stack terminals at a surface of a support element thereof.
Figure 4B:
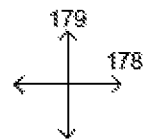

FIGS. 4A-B depict a microelectronic package 410 according to a variation of that described above relative to FIGS. 1A-B, in which the pitch "b" of the first terminals 141 in second direction 178 can be different from the pitch "a" of the second terminals in the second direction. The pitch of the first terminals 141 can also be different from the pitch of the second terminals in a third direction 179 parallel to the first surface 101 and transverse to the first and second directions. Thus, as shown, the pitch of the first terminals can be greater than the pitch of the second terminals in either the second direction or the third direction or both. Alternatively, the pitch of the first terminals can be smaller than the pitch of the second terminals in either the second direction or the third direction or both. In any or all of the embodiments provided herein, the relationship between the pitch of the first terminals and the second terminals can be as described herein with respect to FIGS. 1A-B above or as described herein with respect to FIGS. 4A and 4B.

Figure 1B:
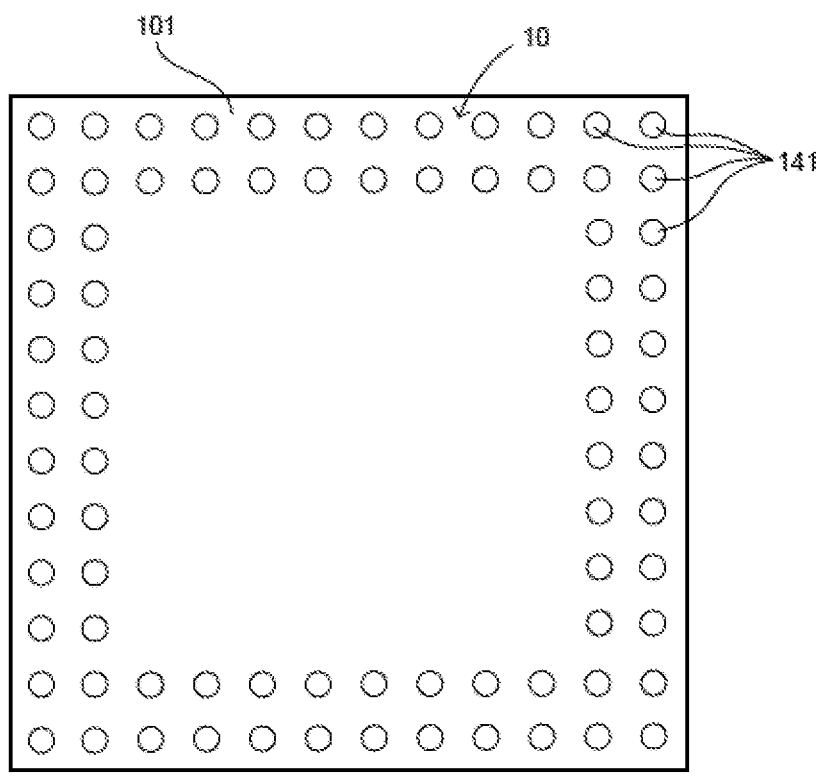
FIG. 1B is a top-down plan view illustrating an example of the microelectronic package of FIG. 1A looking towards a plurality of terminals at a surface of a support element thereof.
Figure 5:
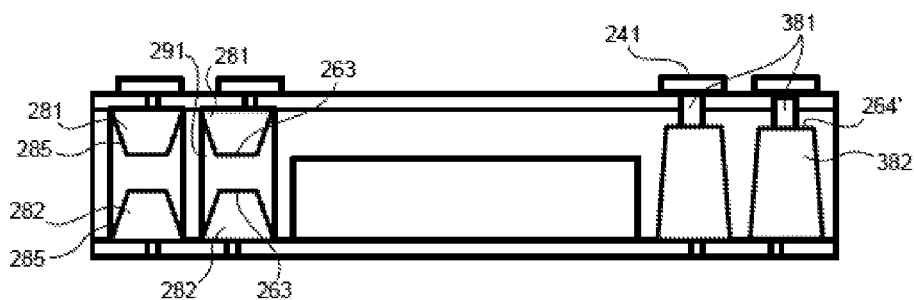
FIG. 5 is a sectional view illustrating a microelectronic package according to an embodiment of the invention.

FIG. 5 illustrates a variation of the microelectronic package seen in FIGS. 1A-B, in which first and second connectors are shown in form of substantially rigid solid metal first posts 281 and second posts 282, each of which may have a structure as described above relative to FIG. 2. However, in this example, ends 263 of the first posts 281 are aligned with and joined with corresponding ends 264 of the second posts 282. In the example shown, the conductive masses 291 which contact the ends and edge surfaces 285 of the posts can join each pair of first and second posts. However, in particular examples, the ends 281, 282 may be joined together through metal to metal joining or diffusion bonding without requiring solder to be used.

In a further example shown in FIG. 5, connectors such as second connectors 382 projecting above the second surface of the second support element 104 can be in form of substantially rigid solid metal posts and the first connectors 381 can be formed by depositing a metal in contact with the ends 264' of the second connectors 382 such as by plating a metal in contact with the end surfaces 264'. In one example, first terminals 241 can be formed by a plating process that forms the first connectors 381 and a metal layer of the first terminals at the same time.

Figure 6:
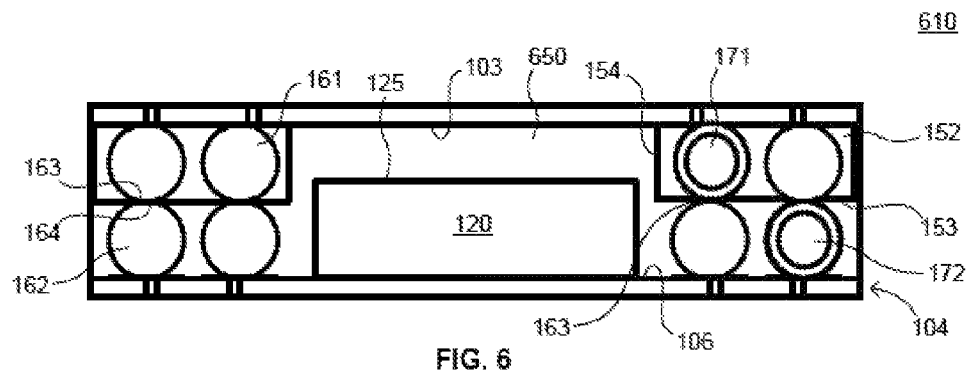
FIG. 6 is a sectional view illustrating a microelectronic package according to an embodiment of the invention.

FIG. 6 depicts a microelectronic package 610 according to a variation of the embodiment shown and described above relative to FIGS. 1A-B or FIGS. 4A-B in which the microelectronic package includes first and second encapsulations 650, 152. In one example, the first connectors such as connectors 161 or connectors 171 can be partially encapsulated within second encapsulation 152, with ends 163 of the first connectors joined with the ends 164 of corresponding second connectors such as connectors 162 or connectors 172 so as to provide electrically conductive paths between the first and second support elements. In this case, monolithic encapsulation 650 can be formed after the first connectors are joined with the second connectors such that the monolithic encapsulation is formed in contact with a face 125 of the microelectronic element 120 which faces away from the support element 104 to which the microelectronic element is mounted. In one example, the monolithic encapsulation 650 can be formed in contact with the second encapsulation 152 such that the resulting package becomes one integral package having a structurally strong encapsulation that integrates the second encapsulation 152 and the monolithic encapsulation 650 that is formed on top and side surfaces 153, 154 of the original second encapsulation and on second surfaces 103, 106 of the first and second support elements 102, 104. The package 610 may have internal interfaces where the monolithic encapsulation 650 contacts surfaces 153, 154 of the second encapsulation 152 and is formed on such surfaces.

Figure 7:
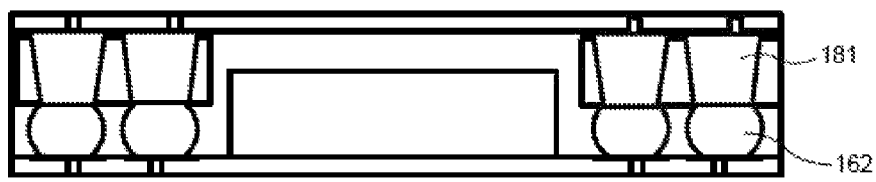
FIG. 7 is a sectional view illustrating a microelectronic package according to an embodiment of the invention.

As further seen in FIG. 7, in a variation of the embodiment shown in FIG. 6, the first connectors can be substantially rigid solid metal posts 181 which are joined to second connectors. In one example, the second connectors can be conductive masses 162 as described above.

Figure 8:
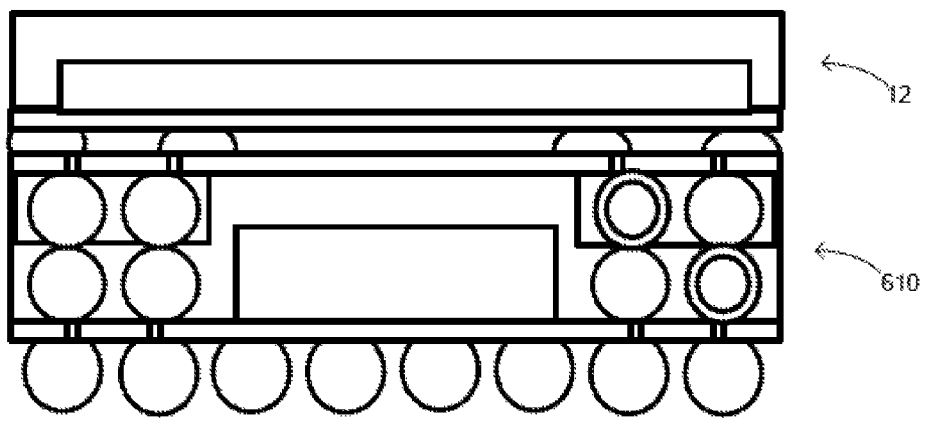
FIG. 8 is a sectional view illustrating a microelectronic assembly according to an embodiment of the invention.

FIG. 8 illustrates an assembly of the microelectronic package 610 seen in FIG. 6 as joined with another component 12 to form a microelectronic assembly similar to the microelectronic assembly described above relative to FIG. 3.

Figure 9:
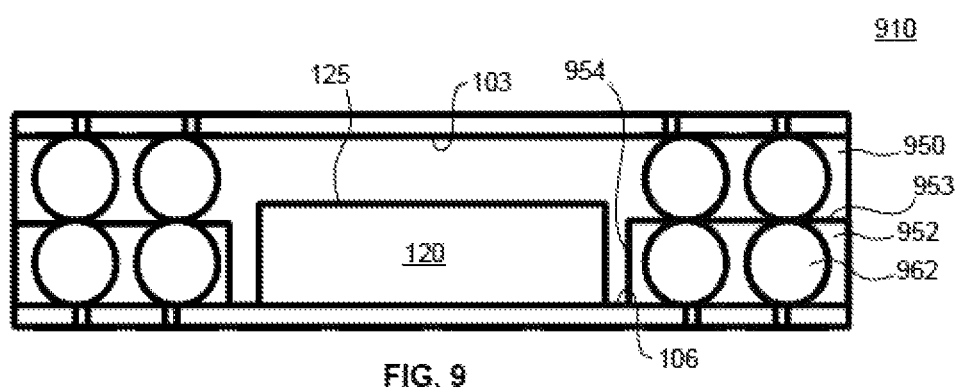
FIG. 9 is a sectional view illustrating a microelectronic package according to an embodiment of the invention.

FIG. 9 illustrates a further variation in which the second encapsulation 952 is formed such that it partially encapsulates the second connectors 962 instead of partially encapsulating the first connectors. In this variation, the monolithic encapsulation 950 can be formed in contact with top and side surfaces 953, 954 of the second encapsulation and in contact with the face 125 of the microelectronic element 120. Encapsulation 950 can be formed in contact with the second surfaces 103, 106 of the first and second support elements.

Figure 10:
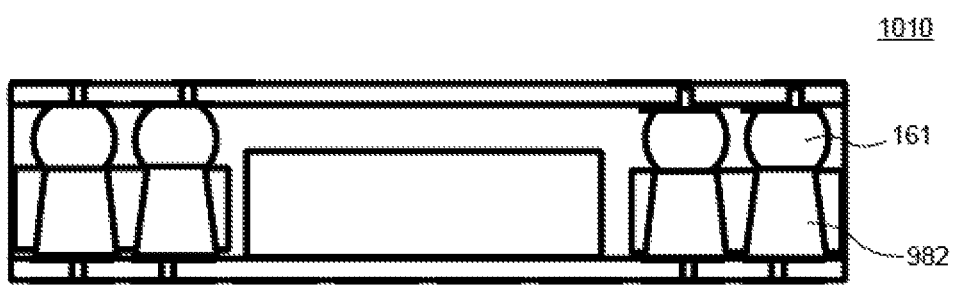
FIG. 10 is a sectional view illustrating a microelectronic package according to an embodiment of the invention.

FIG. 10 depicts a microelectronic package 1010 according to a further variation in which, instead of conductive masses or solder coated solid cores as seen in FIG. 9, the second connectors can be substantially rigid solid metal posts 982, and can be joined with first connectors such as conductive masses 161. In another variation of the package 1010 (not shown), the first connectors can be substantially rigid solid metal posts and the second connectors can be conductive masses.

Figure 11:
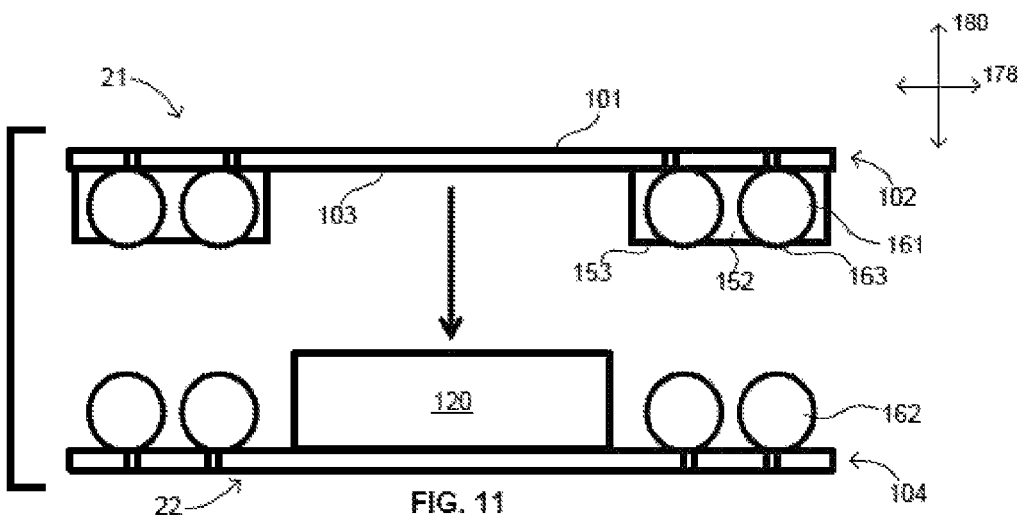
FIG. 11 is a sectional view illustrating a stage in a method of making a microelectronic package according to an embodiment of the invention.
Figure 12:
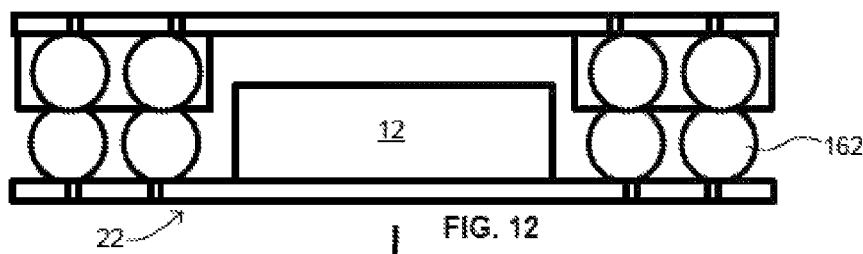
FIG. 12 is a sectional view illustrating a stage in a method of making a microelectronic package according to an embodiment of the invention subsequent to the stage of FIG. 11.
Figure 13:
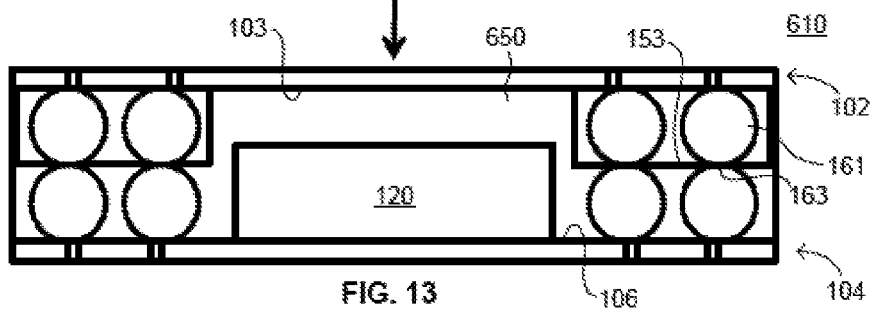
FIG. 13 is a sectional view illustrating a stage in a method of making a microelectronic package according to an embodiment of the invention subsequent to the stage of FIG. 12.

FIGS. 11-13 illustrate stages in a method of forming a microelectronic package 610 in accordance with the embodiment seen in FIG. 6. Thus, as illustrated in FIG. 11, a subassembly including a first support element 102 can be formed having first connectors 161 projecting above the second surface 103 thereof and an encapsulation 152 surrounding individual first connectors 161 and insulating the first connectors from one another. In one example, the encapsulation 152 may be in form of a square or rectangular frame having width in a direction 178 in the view shown, with a central opening in the frame sized to accommodate the microelectronic element 120. Ends 163 of the first connectors 161 are exposed at a surface 153 of the encapsulation 152, and may project above the surface 153 in direction 180 towards the second support element 104, or may be flush with the surface 153, or may be recessed below the surface 153 in a direction towards surface 103 of the first support element.

In one example, subassembly 21 can be formed by forming a structure of the first support element 102 and first connectors 161 projecting above the second surface 103 thereof. First connectors 161 may be conductive masses, or can be other first connectors as described relative to other embodiments above. An encapsulation can then be molded onto the structure such as by injecting an encapsulant into a mold therefor, while a plate of the mold rests against ends 163 of the first connectors 161 such that ends 163 may remain uncovered or not fully covered by the encapsulant. Subsequent deflashing may be used to further uncover the ends of the molded first connectors. In one example, the mold plate can include mold chases sized to accommodate end portions of the first connectors near the ends 163 thereof such that the encapsulant flows around the end portions of the first connectors, and the ends 163 of the first connectors of the resultant subassembly 21 extend above the surface 153 of the molded encapsulation. Similarly, the mold plate can include protrusions at locations aligned with the first connectors so that the first connectors in the resulting subassembly 21 become recessed below the surface 153 of the molded encapsulation.

The encapsulation 152 can include or consist essentially of a polymeric material. Examples of materials of which the encapsulation can be made are a potting compound, epoxies, liquid crystal polymers, thermoplastics, and thermoset polymers. In a particular example, the encapsulation can include a polymeric matrix and particulate loading material within the polymeric matrix, such as formed by molding or otherwise depositing an uncured polymeric material which has the particulate loading material therein onto the second surface 103 of the first support element 102. In one example, the particulate loading material may optionally have a low coefficient of thermal expansion ("CTE"), such that the resulting encapsulation 152 may have a CTE lower than 10 parts per million per degree Celsius hereinafter, "ppm/° C.". In one example, the encapsulation may include a filler material such as glass or ceramic dielectric filler or semiconductor filler among others.

As seen in FIG. 12, the subassembly 21 then can be moved into position for joining with corresponding second connectors 162 attached to second support element 104 of a second subassembly 22. For example, as depicted in FIG. 12, the first and second connectors can be aligned with one another and the first and second support elements can be brought to conditions sufficient for a bond metal included in at least one of the first connectors and the second connectors to flow and form joints between the first connectors and the second connectors. For example, the first connectors can be brought into contact with the aligned second connectors before or during an interval in which a temperature of the first connectors, second connectors or both is raised to a temperature at which the bond metal flows.

As further seen in FIG. 13, an encapsulant 650 can be applied to cover the joined first and second connectors 161, 162, such as, for example, by molding an encapsulant material such as a flowable overmold material onto the second surface 103 of the first support element 102 and to fill spaces between the first and second support elements 102, 104 and between microelectronic element and the surface 103 of the support element 102 adjacent thereto.

In such way, as shown in FIG. 13, an assembly or package 610 is formed such as further described above relative to FIG. 6.

Figure 14:
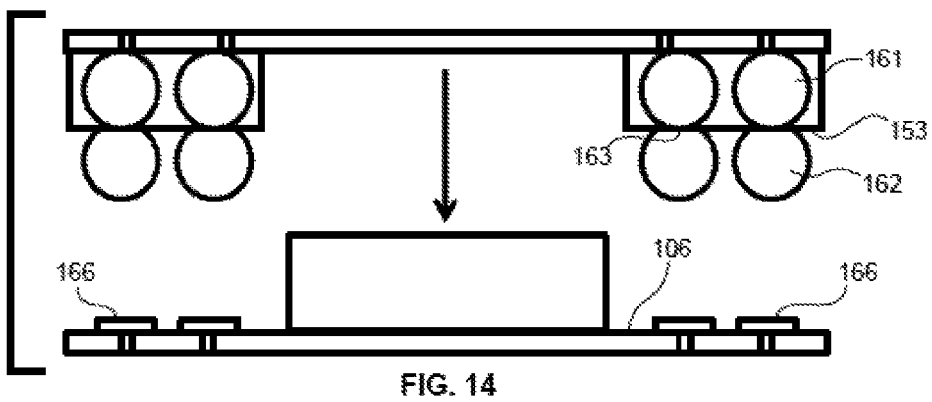
FIG. 14 is a sectional view illustrating a stage in a method of making a microelectronic package according to a variation of the embodiment shown in FIG. 11.

Referring to FIG. 14, in a variation of the method described above relative to FIGS. 11-13, second connectors 162 can be joined with ends 163 of the first connectors 161 exposed at surface 153 of the second encapsulation. Then, the second connectors 162 can be joined with electrically conductive elements 166, e.g., pads, posts, or other electrically conductive connectors, at the second surface 106 of the second support element to form an assembly such as or similar to the assembly seen in FIG. 12. Then, the encapsulant 650 can be applied to the assembly to form an assembly 610 as seen in FIG. 13 and as further described above relative to FIG. 6.

Although not specifically shown in the Figures, the methods described above relative to FIGS. 11-14 can be used with any of the types of first connectors and second connectors which are described above relative to FIGS. 1A-B, 2, 4A-B, 5, 6, and 7, without limitation. With respect to any or all of the microelectronic packages and assemblies herein, the processes of forming one or more of the encapsulations or for forming any or all of the first connectors and/or second connectors and terminals may be as further shown and described in U.S. application Ser. No. 11/166,982 (Tessera 3.0-358 CIP); Ser. No. 11/717,587 (Tessera 3.0-358 CIP CIP); Ser. No. 11/666,975 (Tessera 3.3-431); Ser. No. 11/318,404 (Tessera 3.0-484); Ser. No. 12/838,974 (Tessera 3.0-607); Ser. No. 12/839,038 (Tessera 3.0-608); Ser. No. 12/832,376 (Tessera 3.0-609) and Ser. No. 09/685,799 (TIPI 3.0-201), the disclosures of which are incorporated by reference herein.

Figure 15:
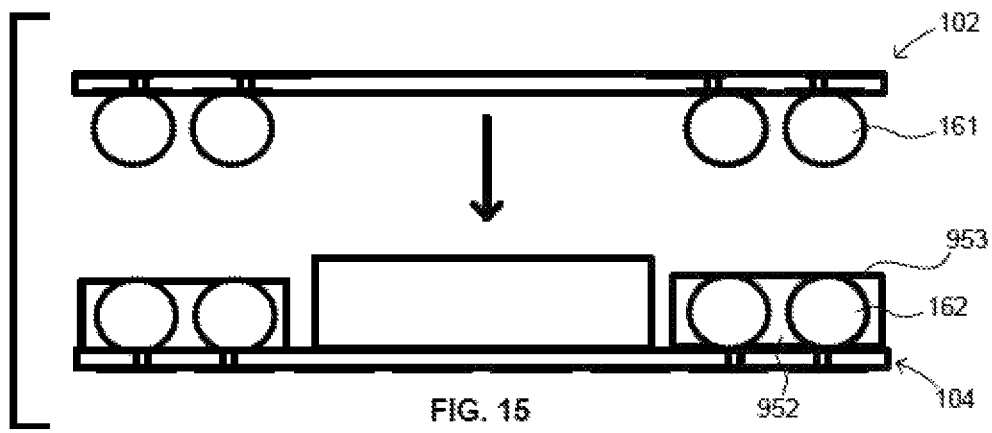
FIG. 15 is a sectional view illustrating a stage in a method of making a microelectronic package according to an embodiment of the invention.
Figure 16:
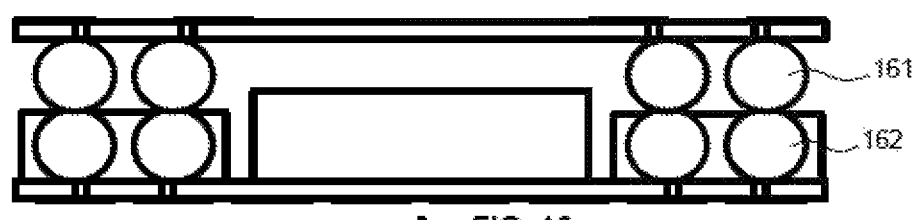
FIG. 16 is a sectional view illustrating a stage in a method of making a microelectronic package according to an embodiment of the invention subsequent to the stage of FIG. 15.
Figure 17:
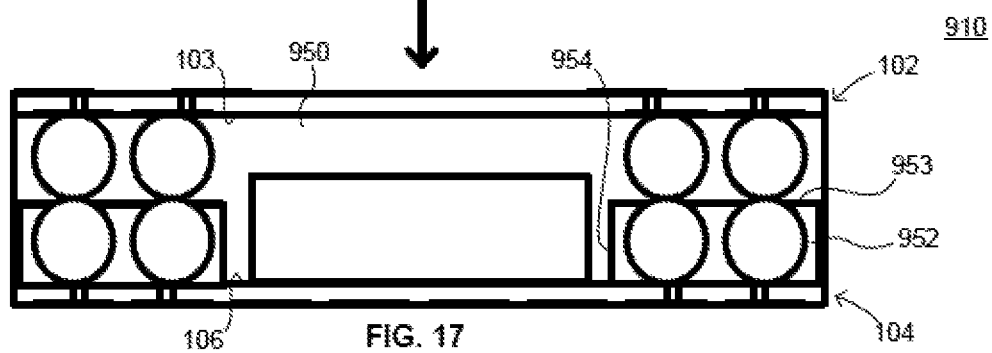
FIG. 17 is a sectional view illustrating a stage in a method of making a microelectronic package according to an embodiment of the invention subsequent to the stage of FIG. 16.

FIGS. 15-17 illustrate stages in a method of forming a microelectronic package 910 in accordance with the embodiment seen in FIG. 9. In this variation, second connectors 162 on the second support element 103 are partially encapsulated within second encapsulation 952 prior to the second connectors 162 being joined with respective first connectors 161 to form an assembly as seen in FIG. 16. Thereafter, an encapsulation 950 can be applied to form an assembly 910 as seen in FIG. 17 and as described above relative to FIG. 9, where encapsulation 950 can contact surfaces 953, 954 of the second encapsulation 952 and second surfaces 103, 106 of the first and second support elements 102, 104.

Figure 18:
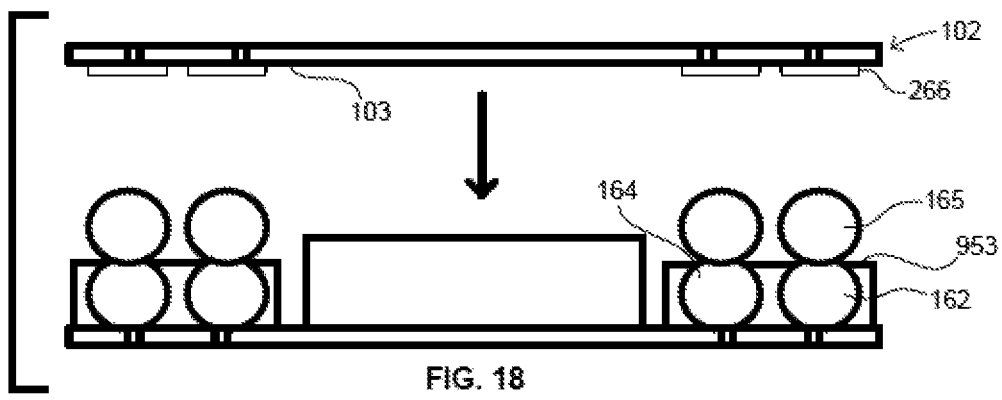
FIG. 18 is a sectional view illustrating a stage in a method of making a microelectronic package according to a variation of the embodiment shown in FIG. 15.

FIG. 18 illustrates a variation of the method described above relative to FIGS. 15-17 in which connectors 165 can be joined with ends 164 of the second connectors 162 exposed at surface 953 of the second encapsulant. Then, the connectors 165 can be joined with electrically conductive elements 266, e.g., pads, posts, or other electrically conductive connectors, at the second surface 103 of the first support element 102 to form an assembly such as or similar to the assembly seen in FIG. 16. Then, an encapsulant 950 can be applied to the assembly to form an assembly 910 as seen in FIG. 17 and as described above relative to FIG. 9.

Figure 19:
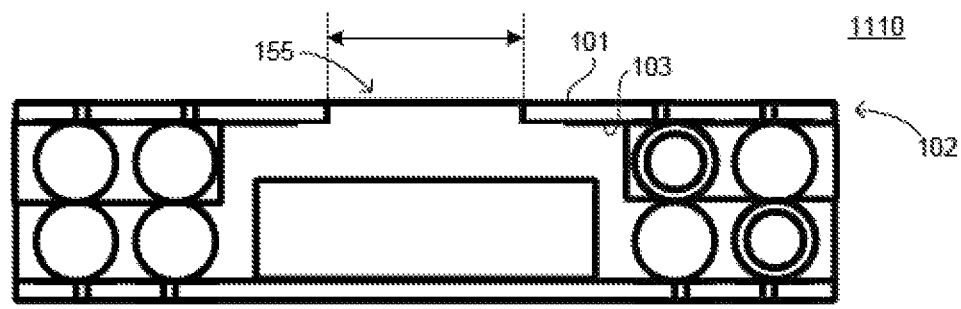
FIG. 19 is a sectional view illustrating a microelectronic package according to an embodiment of the invention.

FIG. 19 illustrates an assembly 1110 according to an example in which first support element 102 includes an opening 155 extending between the first and second surfaces 101, 103 thereof. In one example, opening can be used as a port through which an encapsulant can be supplied into an interior space between the first and second support elements when manufacturing the assembly 1110.

Figure 20:
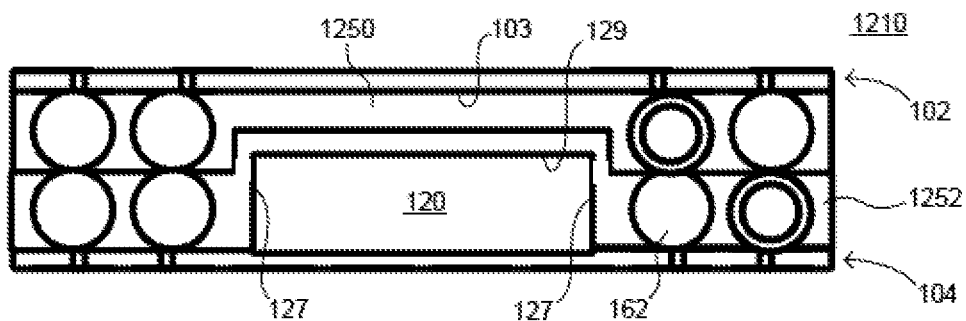
FIG. 20 is a sectional view illustrating a microelectronic package according to an embodiment of the invention.

FIG. 20 illustrates an assembly 1210 according to a variation of the embodiment described relative to FIGS. 9 and 17 above in which encapsulation 1252 includes an additional portion overlying the microelectronic element 120. In the example shown, encapsulant 1252 is formed as a monolithic region partially encapsulating second connectors 162 and extending onto a major surface 129 and edge surfaces 127 of the microelectronic element. Major surface 129 can be a front face as described above relative to FIG. 1A when the microelectronic element is mounted face-up on second support element 104. Alternatively, major surface 128 can be a rear face of the microelectronic element 120 opposite from the front face when the microelectronic element faces toward the second support element 104. In this example, encapsulation 1250 can be formed in contact with the encapsulation 1252 and can overlie or be in contact with second surface 103 of first support element 102.

Figure 21:
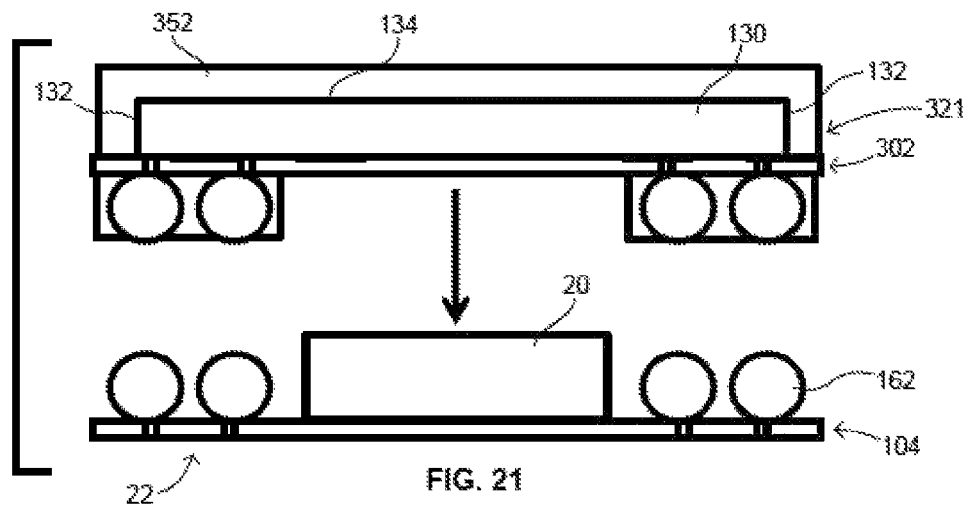
FIG. 21 illustrates a stage in a method of fabricating a microelectronic assembly according to an embodiment of the invention.
Figure 22:
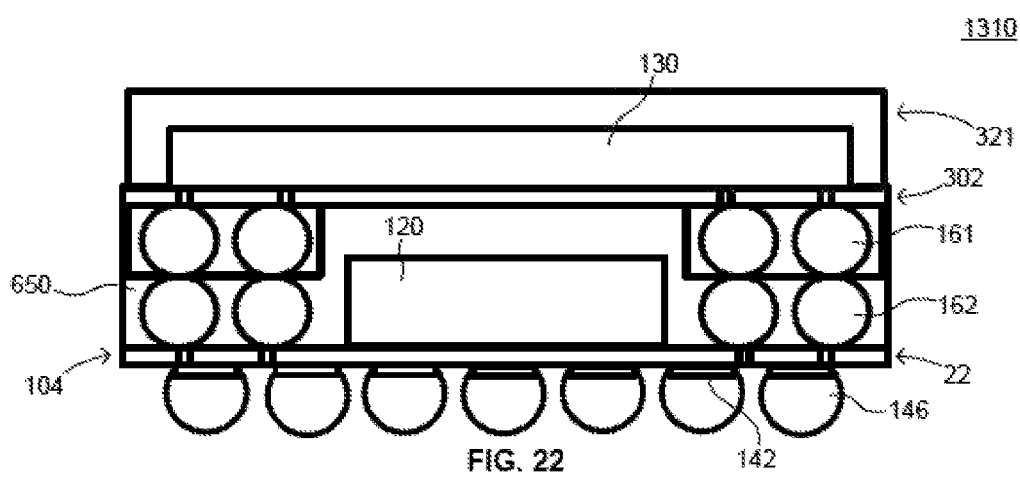
FIG. 22 illustrates a microelectronic assembly formed according to the method depicted in FIG. 21.

FIGS. 21-22 depict processing according to a variation of the method described above relative to FIGS. 11-13. As shown in FIG. 21, subassembly 321 can itself be a microelectronic package in which a microelectronic element 130 has contacts electrically coupled to a support element 302 thereof, in similar fashion to the coupling between microelectronic element 20 and support element 104 as described above relative to FIG. 1A. In some examples, an encapsulation 352 may cover edge surfaces 132 of the microelectronic element 130, and may in some cases cover a major surface 134 of the microelectronic element which faces away from the support element 302 of subassembly 321.

Referring to FIG. 22, then, the connectors 161 of subassembly 321 can be aligned and joined with corresponding connectors 162 of the second subassembly 22 and an encapsulation 650 can be formed in spaces between microelectronic element 120 and subassembly 321 to form a multi-level stacked and electrically coupled assembly 1310 which includes the microelectronic elements 120, 130, the support elements 302, 104 to which they are coupled, such that microelectronic elements 120, 130 can be electrically coupled with one another through the support elements 104, 302 and the first and second connectors 161, 162. Joining elements 146, e.g., solder balls, such as described above relative to FIG. 3, can be applied to terminals 142 of support element 104, typically after forming encapsulation 650.

Figure 23:
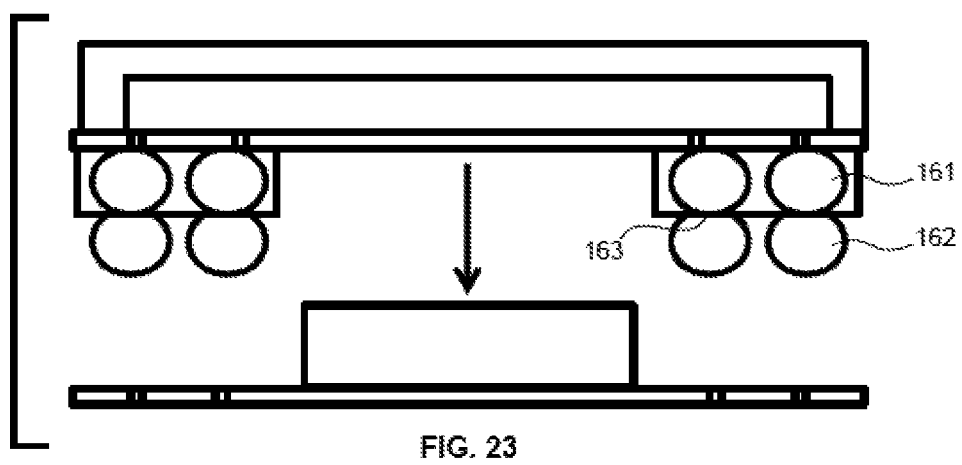
FIG. 23 illustrates a variation of the method of fabrication depicted in FIG. 21.

FIG. 23 illustrates a variation thereof, similar to that shown in FIG. 14, in which the process of assembling the first and second subassemblies is carried out with second connectors 162 already attached to ends 163 of first connectors.

Figure 24:
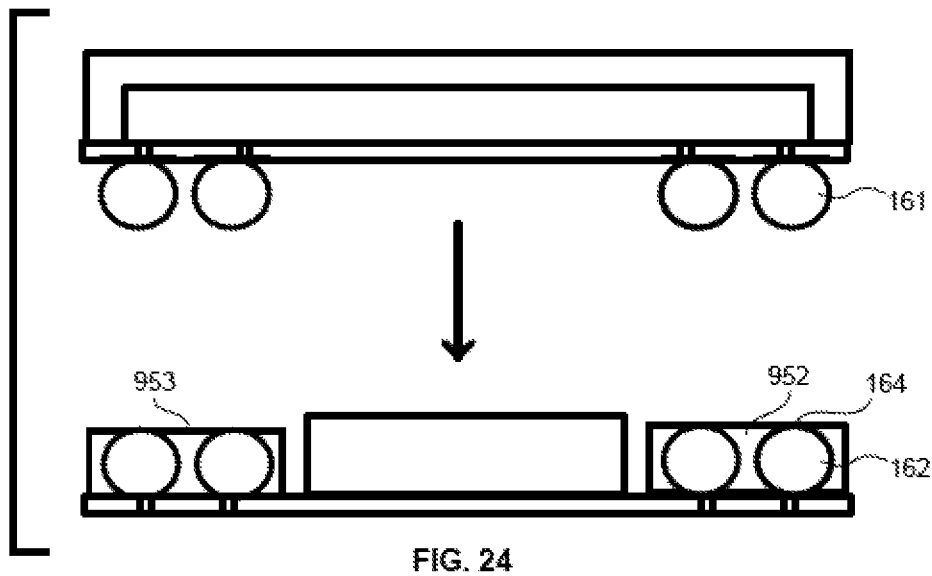
FIG. 24 illustrates a variation of the method of fabricating a microelectronic assembly seen in FIG. 21.
Figure 25:
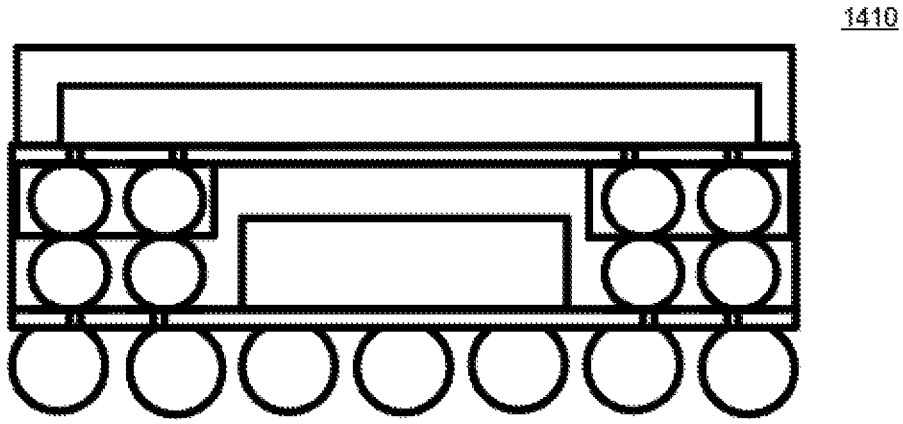
FIG. 25 illustrates a microelectronic assembly formed according to the method depicted in FIG. 24.

FIG. 24 illustrates that in a variation similar to that shown in FIGS. 15-17 above, the assembling process can be carried in a state in which encapsulation 952 partially covers second connectors 162 and in which first connectors 161 are joined with ends 164 of the second connectors 162 which are exposed at surface 953 of the encapsulation 952. FIG. 25 illustrates a resulting assembly 1410 formed in this manner.

Figure 26:
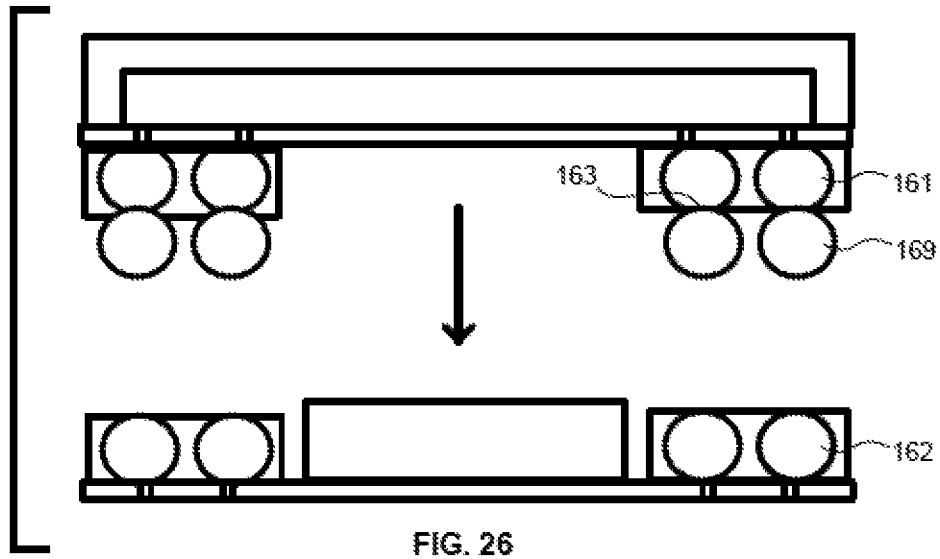
FIG. 26 illustrates a stage in a method of fabricating a microelectronic assembly according to a variation of the embodiment seen in FIGS. 11-14.
Figure 27:
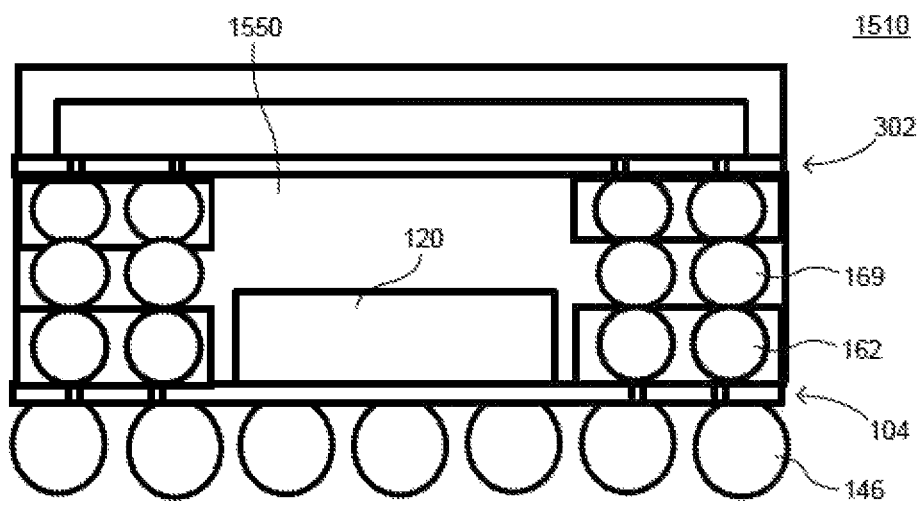
FIG. 27 illustrates a microelectronic assembly formed from the method depicted in FIG. 26.

FIGS. 26-27 illustrate another variation in which both first connectors 161 and second connectors 162 in respective subassemblies can be partially encapsulated as discussed above with respect to the methods shown in FIGS. 11-13, and 15-17. However, in this case, third connectors 169, which may be in form of electrically conductive masses such as described above, can be attached and electrically coupled with ends 163 of the first connectors as shown. As further shown in FIG. 27, the third connectors 169 can be aligned with and joined with the second connectors 162, and the resulting assembly 1510 can then be encapsulated in a third encapsulation 1550 filling spaces between individual third connectors 169 and filling spaces between microelectronic element 120 and support element 302. The assembly 1510 may also be formed with joining elements 146 attached to support element 104 for further connection with corresponding contacts of an external component as described above.

Figure 28:
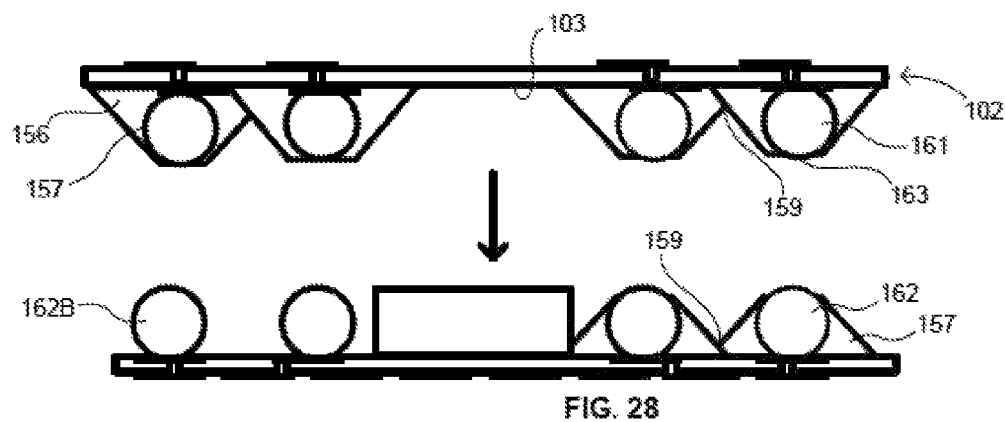
FIGS. 28-29 illustrate stages in a method of fabricating a microelectronic assembly according to a variation of the embodiment seen in FIGS. 11-14.
Figure 29:
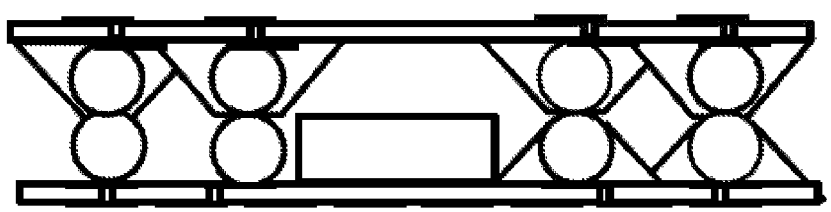
Figure 30:
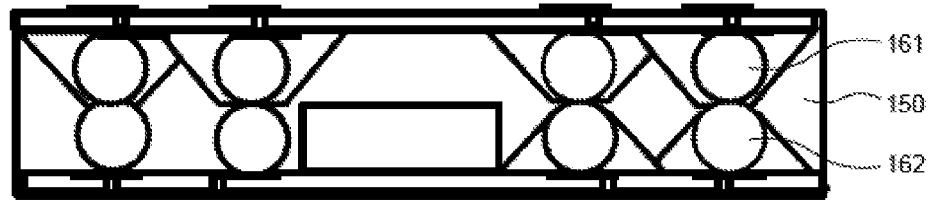
FIG. 30 illustrates a microelectronic assembly formed according to the method depicted in FIGS. 28-29.

FIGS. 28-30 illustrate processing according to another variation of the methods described above. In this example, the partial encapsulation on first connectors or on second connectors or on both can be omitted. Instead, as shown in FIG. 28, a dielectric reinforcing collars 156 may be present around individual ones of the first connectors 161, second connectors 162, or both. As seen in FIG. 28, the reinforcing collars 156 include portions 157 overlying outer surfaces of respective individual connectors, e.g., generally spherical surfaces of conductive masses, or alternatively walls of adjacent posts or other connectors, and the reinforcing collars may form troughs 159 where adjacent reinforcing collars meet. The reinforcing collars can be formed by flowing a material onto a surface 103 of the support element 102, which may then flow to locations on the surface 103 at which first connectors 161 are attached. For example, a dielectric reinforcing material can be dispensed as a liquid which flows to areas surrounding individual ones of the first connectors. In some examples, a vacuum application, roller coat, spray-coat, dispensing or screening process may be used with a liquid material in forming a part or all of the reinforcing collars. The dielectric reinforcing material may wick up around the connectors so as to support exterior surfaces of the connectors while leaving their ends 163 exposed, and to prevent or substantially prevent collapse of the connectors reinforced thereby when such connectors are joined with other connectors to form the assemblies or packages described herein. A deflashing procedure may in some cases be employed to remove relatively small amounts of the reinforcing material overlying ends 163. As further seen in FIG. 28, such reinforcing material 156 can be present at and around second connectors 162 as well. Alternatively, the reinforcing layer can be omitted, as seen in the case of second connectors 162b. In one example, the reinforcing material can be or include an epoxy material such as an underfill material having a dielectric particulate loading material, such as commonly dispensed to an interface between a contact-bearing face of a microelectronic element such as a semiconductor chip and a surface of a substrate to which the chip is flip-chip attached and electrically interconnected. The reinforcing collars may in some cases reduce the CTE of the subassembly over which it is applied.

As further shown in FIG. 29, subassemblies having first and second connectors with ends therein exposed can be joined together in a manner similar to that described above.

Thereafter, as seen in FIG. 30, the joined subassemblies can be mechanically reinforced with an encapsulation 150 filling in spaces between the subassemblies and further reinforcing the joints between first and second connectors. As seen in FIG. 30, the joined first and second connectors 161, 162 can provide increased height and increased aspect ratio of connections between the first and second support elements, in a manner similar to that describe for the foregoing embodiments.

In a variation of the embodiment shown in FIGS. 28-30, the stiffening layer may overlie walls of only the second connectors or may overlie walls of only some of the second connectors. The first connectors, the second connectors or both the first and second connectors may be conductive masses or may be any of the types of connectors shown and discussed in the foregoing.

In further variation, a microelectronic package such as the package 321 shown and described above in FIG. 21 can be substituted for the subassembly in FIG. 28 which includes support element 102 and such subassembly can be joined with another microelectronic package to form an assembly similar to that depicted in FIG. 29.

Figure 31:
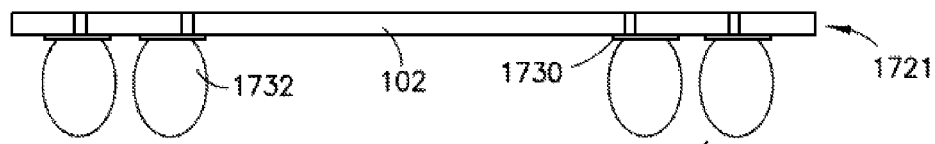
FIGS. 31-36 are sectional views illustrating successive stages in a method of fabricating a microelectronic assembly in accordance with an embodiment of the invention.

Referring to FIGS. 31-36, in another variation of any of the embodiments shown and described above, a first subassembly 1721 (FIG. 31) is provided which comprises a support element 102 such as any of the support elements described above, and connectors 1732 extending away from a surface 102 of the support element. The connectors 1732 can be any of the connectors described in the foregoing, such as, but not limited to: conductive masses, e.g., reflowable masses which may include tin, indium, solder or a eutectic, or alternatively, posts, wires, stud bumps or masses having solid cores, or any combination of the foregoing. As in the above-described embodiments, posts may be or include monolithic metal regions which consist essentially of copper. A bond metal can be provided on an exterior surface of such connectors. Thus, in a particular example as illustrated in FIG. 31, the connectors 1732 may be electrically conductive masses such as bond metal masses or solder masses joined to electrically conductive elements 1730, e.g., pads, stud bumps, etc., at a surface 103 thereof. In this variation, the first subassembly 1721 can be processed prior to assembling the first subassembly with a second subassembly 1725 (FIG. 35) to form a modified first subassembly 1723 9FIG. 340 in which extremities 1734 of the first connectors 1732 project beyond a surface of an insulating structure 1744, e.g., encapsulation.

Figure 32:
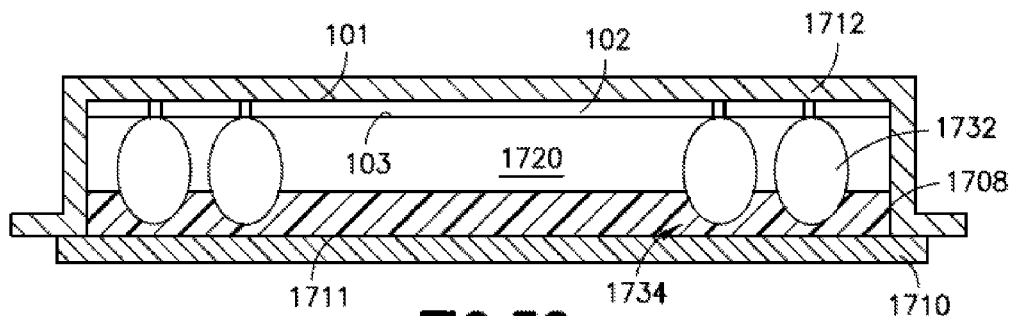
Figure 33:
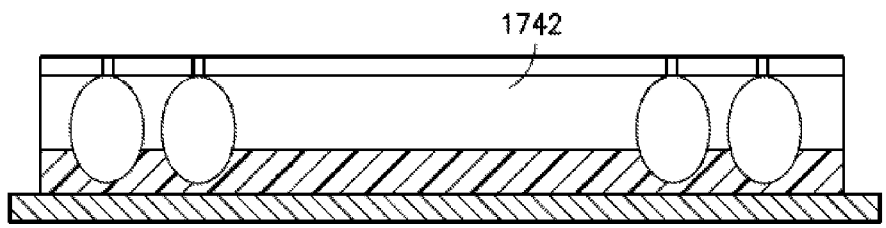

Specifically, referring to FIG. 32, processing can be performed such that the extremities 1734 of first connectors 1732 project into a temporary layer 1708 and are covered by the temporary layer. To form the insulating structure, the support element and the temporary layer may rest on opposite internal surfaces of respective mold plates 1712, 1710, and a curable dielectric material can be flowed within a cavity 1720 between the support element 102 and the temporary layer 1708. The temporary layer will keep the dielectric material from covering up the connector extremities 1734 during this process. Subsequently, when the mold plates are removed (FIG. 33), the extremities 1734 of the first connectors are free of the insulating structure such that the extremities 1734 project beyond the surface 1744 of the insulating structure 1742.

Figure 34:
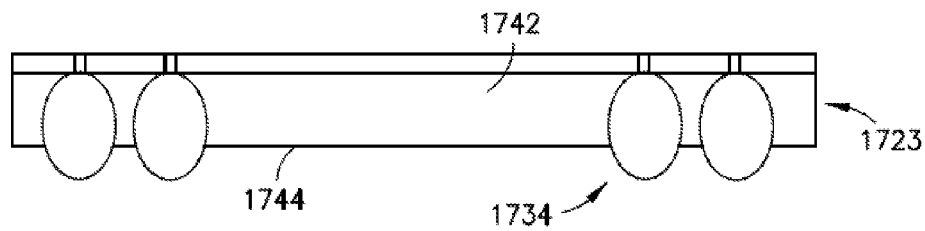

In one example, the temporary layer 1708 may be a film which extends along an inner surface of a mold plate. In such example, the film can be placed between a plate 1710 of a mold and the support element 102. The film may rest on an interior surface 1711 of the mold plate 1710 as shown. An outwardly facing surface 101 of the support element 102 is disposed such that it directly or indirectly rests on a second plate 1712 of the mold opposite the first mold plate 1710. When the mold plates 1710, 1712 are brought together, extremities 1734 of the connectors 1732 project into the film 1708 and are covered by the film. A dielectric material such as an encapsulant or mold compound, among others, can then be flowed in the cavity 1720 and at least partially cured so as to form an insulating structure 1742 (FIG. 33), leaving the extremities 1734 of the connectors uncovered by the dielectric material as they are protected by the film 1708. Referring to FIG. 34, after the mold plates and the temporary film 1708 are removed, the extremities of the connectors in the resulting subassembly 1723 project beyond a surface 1744 of the insulating structure 1742 or encapsulation.

In a variation of the above-described processing, instead of using a removable film as described above, a water-soluble film can be placed on an inner surface of the mold plate 1710 in place of temporary layer 1708 prior to forming the encapsulation layer. When the mold plates are removed, the water soluble film can be removed by washing it away so as to leave the extremities 1734 of the connectors projecting beyond the surface 1744 of the insulating structure 1742 or encapsulation layer as described above.

Figure 35:
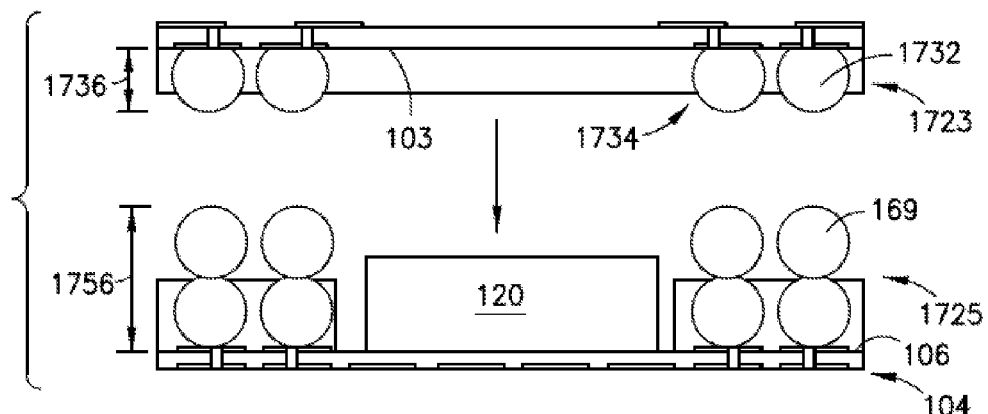

FIG. 35 illustrates use of the first subassembly 1723 in forming an assembly similar to the assembly 1510 shown and described above with respect to FIG. 27. As shown in FIG. 35, the extremities 1734 of the first connectors 1732 are aligned with corresponding second connectors 169, e.g., conductive masses of a second subassembly 1725, such that the extremities 1734 are juxtaposed with the extremities of the connectors 169. As in one or more of the above-described embodiments, the second subassembly 1725 may comprise a microelectronic element 120 electrically coupled to support element 104, the microelectronic element projecting above a surface 106 of the second support element 104 of the second subassembly. As seen in FIG. 35, the extremities of the first connectors 1732 may be disposed at maximum heights 1736 from the surface 103 of the first support element. Likewise, the extremities of the second connectors 169 may be disposed at maximum heights 1756 from the surface 106 of the second support element 104. The second subassembly 1725 may comprise a third insulating structure 1752 comprising an at least partially cured third dielectric material. The third insulating structure 1752 may be a molded encapsulation as described above.

Figure 36:
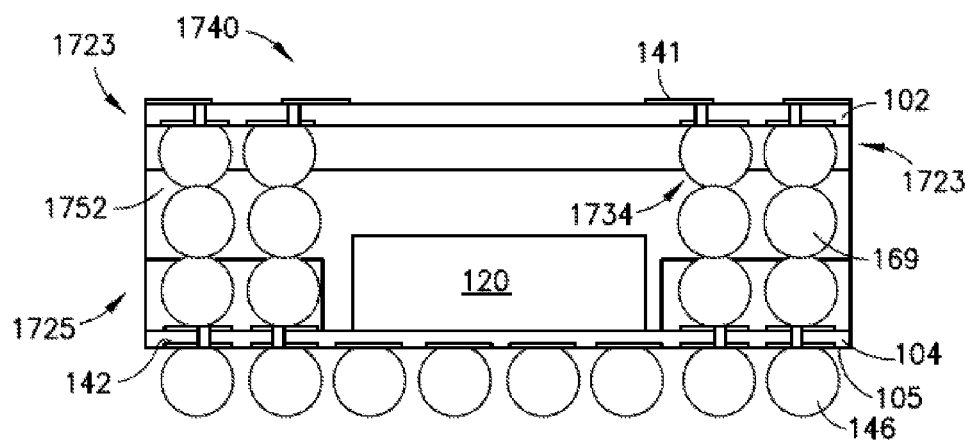

Then, as further shown in FIG. 36, subassembly 1723 is united with the second subassembly in a package 1740 such that the extremities 1734 of the connectors are joined with the corresponding connectors 169. A second insulating structure or encapsulation can then be formed, for example, by flowing a second dielectric material to fill spaces between and among the connectors 169 and fill a volume between microelectronic element 120 and between the first and second support elements 102 and 104. The second insulating structure may be made of a same dielectric material or a different material from that of the first dielectric material. As in any or all of the embodiments shown and described, for example, with reference to FIGS. 1-21 and 28-30, first terminals 141 can be provided at an outwardly-facing surface of the first subassembly 1723. FIG. 36 further shows joining elements 146 attached to second terminals 142 provided at an outwardly-facing surface 105 of the second subassembly 1725 of assembly 1740. Assembly 1740 can be a microelectronic package, which can be suitable for mounting to another component, e.g., a circuit panel (not shown) through joining elements 146. In some embodiments in which terminals 141 are present, the assembly 1740 can be utilized as a package-on-package ("PoP") assembly, for connecting terminals of one or more additional microelectronic packages to the terminals 141.

In other variations (not shown), any of the assembling processes depicted in FIG. 11-14, 15-18 or 21-30 can be carried out in a state in which one or both of the subassemblies having microelectronic elements or support elements as described therein is replaced by different structure. Specifically, one or both of the subassemblies can be or can include a multi-level stacked and electrically interconnected assembly of microelectronic elements and support elements coupled to respective microelectronic elements at each level of such subassembly.

Figure 37:
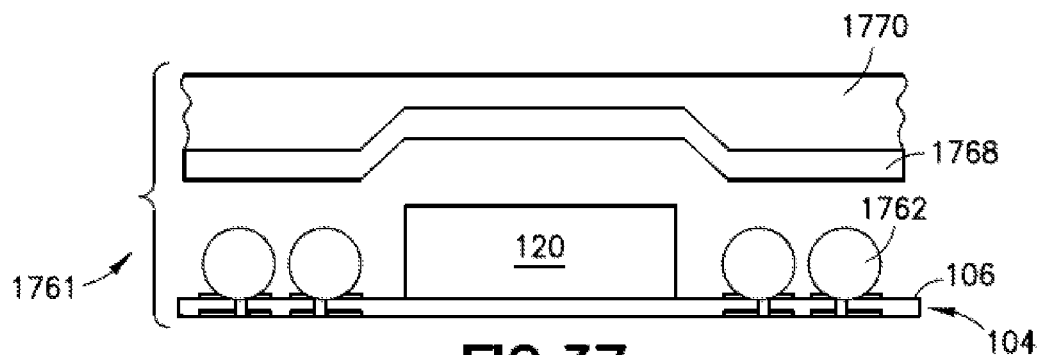
FIGS. 37-40 are sectional views illustrating successive stages in a method of fabricating a microelectronic assembly in accordance with a variation of the embodiment depicted in FIGS. 31-36.
Figure 38:
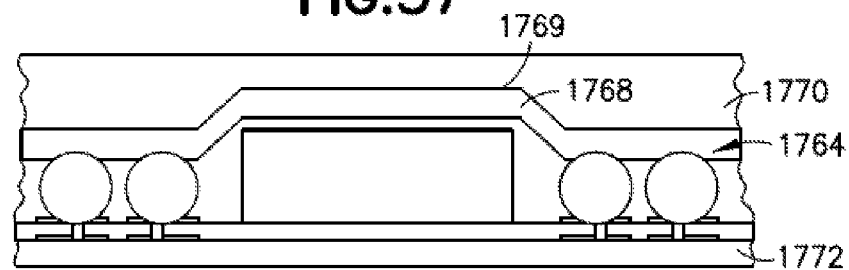
Figure 39:
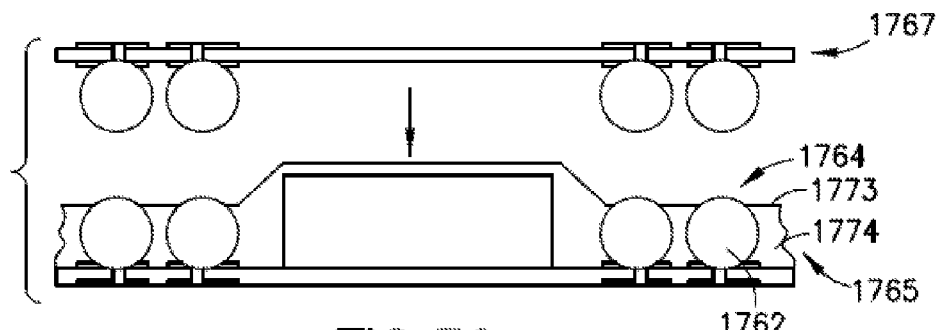
Figure 40:
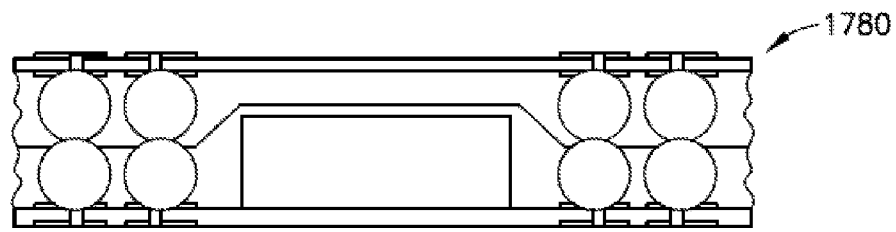

Referring to FIGS. 37-40, in a further variation, a first insulating structure can be formed on a subassembly 1761 which comprises second support element 104, and a microelectronic element 120 and second connectors 1762, all facing upwardly away from a surface 106 of the support element 104. Temporary layer 1768 such as a film is provided on an interior surface 1769 of a mold plate 1770. Then, as shown in FIG. 37, when mold plates 1770, 1772 are brought to bear on the subassembly 1761, extremities 1764 of the connectors project into the temporary layer 1768 and are covered thereby. Thereafter, a dielectric material is flowed within the mold cavity to form insulating structure 1774, and then the temporary layer is removed, resulting in the subassembly 1765 as seen in FIG. 39. This first subassembly 1765 can then be united with a second subassembly 1767 by processing such as described above with respect to FIG. 15, except that extremities 1764 of the connectors 1762 project beyond a surface 1773 of the insulating structure. FIG. 40 illustrates an assembly 1780 formed by uniting the first and second subassemblies, the assembly having external connection capabilities through terminals, etc., such as provided in any of the embodiments described above.

Figure 41:
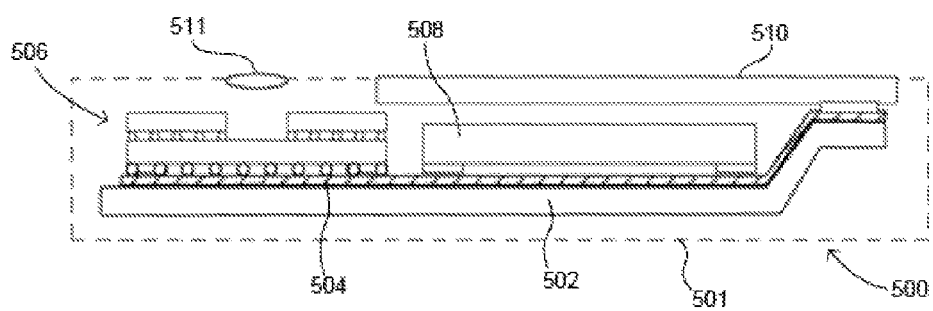
FIG. 41 is a schematic diagram illustrating a system in accordance with an embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, as seen in FIG. 41, a system 500 in accordance with a further embodiment of the invention includes a structure 506 as described above in conjunction with other electronic components 508 and 510. In the example depicted, component 508 is a semiconductor chip whereas component 510 is a display screen, but any other components can be used. Of course, although only two additional components are depicted in FIG. 41 for clarity of illustration, the system may include any number of such components. The structure 506 as described above may be, for example, a microelectronic package as provided with respect to any of the embodiments described above or may be a microelectronic assembly such as discussed above with respect to FIG. 3, or FIG. 8. Structure 506 and components 508 and 510 are mounted in a common housing 501, schematically depicted in broken lines, and are electrically interconnected with one another as necessary to form the desired circuit. In the exemplary system shown, the system includes a circuit panel 502 such as a flexible printed circuit board, and the circuit panel includes numerous conductors 504, of which only one is depicted in FIG. 21, interconnecting the components with one another. However, this is merely exemplary; any suitable structure for making electrical connections can be used. The housing 501 is depicted as a portable housing of the type usable, for example, in a cellular telephone or personal digital assistant, and screen 510 is exposed at the surface of the housing. Where structure 506 includes a light-sensitive element such as an imaging chip, a lens 511 or other optical device also may be provided for routing light to the structure. Again, the simplified system shown in FIG. 21 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A method of fabricating a microelectronic assembly, comprising:
    processing a first subassembly such that extremities of electrically conductive first connectors of the first subassembly project into a temporary layer, the first connectors extending in a direction away from a first support element of the first subassembly;
    forming a first insulating structure of the first subassembly comprising flowing a first dielectric material into spaces between individual first connectors between the temporary layer and the support element and at least partially curing the first dielectric material;
    removing the temporary layer so that extremities of the first connectors project beyond a surface of the first insulating structure of the first subassembly;
    uniting the first connectors with electrically conductive second connectors of a second subassembly juxtaposed therewith to form an assembly, wherein at least one of the first and second subassemblies has at least one microelectronic element mounted to an inwardly facing surface of the respective support element; and
    forming a second insulating structure comprising flowing a second dielectric material into spaces between adjacent ones of the second connectors and between the first connectors joined thereto.

2. The method as claimed in claim 1, wherein the assembly comprises first terminals at an outwardly facing surface of the first subassembly and second terminals at an outwardly facing surface of the second subassembly, wherein the first terminals are electrically coupled with the second terminals, and the microelectronic element is electrically coupled with at least one of: the first terminals or the second terminals.

3. The method as claimed in claim 1, wherein at least one of: the first connectors or the second connectors comprise posts having monolithic metal regions consisting essentially of copper.

4. The method as claimed in claim 1, wherein at least one of: the first connectors or the second connectors comprise wires.

5. The method as claimed in claim 1, wherein the electrically conductive elements are second connectors projecting above the surface of the support element of the second subassembly towards the first connectors.

6. The method as claimed in claim 5, wherein the first and second dielectric materials are encapsulants.

7. The method as claimed in claim 5, wherein the second subassembly includes a third insulating structure filling spaces between at least some of the second connectors, wherein forming the second insulating structure comprises flowing the second dielectric material in contact with the first and second insulating structures.

8. The method as claimed in claim 5, wherein the first connectors and the second connectors have extremities at maximum heights above the respective surface of the first and second support elements, respectively, and the extremities of the first connectors are aligned with and joined with extremities of the second connectors.

9. The method as claimed in claim 5, wherein a bond metal is provided at extremities of at least one of: the first connectors, or the second connectors, wherein the uniting joins the first connectors with the second connectors through the bond metal.

10. The method as claimed in claim 5, wherein at least one of: the first connectors or the second connectors comprise electrically conductive masses, wherein the uniting joins the electrically conductive masses with corresponding ones of the first or second connectors.

11. The method as claimed in claim 5, wherein at least one of: the first connectors or the second connectors are reflowable masses comprising at least one of tin, indium, solder or a eutectic composition, wherein the uniting comprises reflowing at least portions of the reflowable masses which extend beyond at least one of the first insulating structure or the second insulating structure.

12. A method of fabricating a microelectronic assembly, comprising:
    embedding portions of electrically conductive first masses of a first subassembly into a film, the first masses extending in a direction away from a first support element of the first subassembly;
    forming a first encapsulation comprising flowing a first encapsulant into spaces between individual first masses between the film and the support element and at least partially curing the first encapsulant;
    removing the film so that the first masses project beyond a surface of the first encapsulation;
    uniting the first subassembly with a second subassembly to form an assembly, the second subassembly having a second support element and electrically conductive connectors at a surface thereof, wherein the uniting comprises joining the first masses at locations beyond the first encapsulation with the electrically conductive connectors of the second subassembly, wherein at least one of the subassemblies has at least one microelectronic element mounted to an inwardly facing surface of the respective support element; and
    and forming a second encapsulation comprising flowing a second encapsulant into spaces between adjacent ones of the electrically conductive connectors and the portions of the first masses joined thereto and at least partially curing the second encapsulant.

13. The method as claimed in claim 12, wherein a bond metal is provided at extremities of the connectors and the first masses are joined to the connectors through the bond metal.

14. The method as claimed in claim 12, wherein the connectors comprise posts having monolithic metal regions consisting essentially of copper.

15. The method as claimed in claim 12, wherein at least one of: the first masses or the electrically conductive connectors are first reflowable masses comprising at least one of tin, indium, solder or a eutectic composition, wherein the uniting comprises reflowing at least portions of the reflowable masses.

16. The method as claimed in claim 15, wherein the electrically conductive connectors comprise electrically conductive second reflowable masses comprising at least one of tin, indium, solder or a eutectic composition, wherein the uniting comprises reflowing at least portions of the first reflowable masses and at least portions of the second reflowable masses which extend beyond the first insulating structure and the second insulating structure, respectively.

17. The method as claimed in claim 16, wherein the second subassembly includes a third encapsulation filling spaces between at least some of the second reflowable masses, wherein the second encapsulation is formed between the first and third encapsulations.

\* \* \* \* \*